US011285599B2

(12) United States Patent
Diller et al.

(10) Patent No.: US 11,285,599 B2
(45) Date of Patent: Mar. 29, 2022

(54) MOBILE DEVICE FOR GRASPING AND ACTIVE RELEASE OF OBJECTS

(71) Applicant: THE GOVERNING COUNCIL OF THE UNIVERSITY OF TORONTO, Toronto (CA)

(72) Inventors: Eric Diller, Toronto (CA); Jiachen Zhang, Toronto (CA)

(73) Assignee: The Governing Council of the University of Toronto, Toronto (CA)

( * ) Notice: Subject to any disclaimer, the term of this patent is extended or adjusted under 35 U.S.C. 154(b) by 427 days.

(21) Appl. No.: 16/003,612

(22) Filed: Jun. 8, 2018

(65) Prior Publication Data

US 2018/0354120 A1   Dec. 13, 2018

Related U.S. Application Data

(60) Provisional application No. 62/516,891, filed on Jun. 8, 2017.

(51) Int. Cl.
*B25J 7/00* (2006.01)
*H01F 1/06* (2006.01)
*H01F 41/02* (2006.01)
*H01F 7/02* (2006.01)
*B25J 15/12* (2006.01)
(Continued)

(52) U.S. Cl.
CPC ............. *B25J 7/00* (2013.01); *B25J 15/12* (2013.01); *B81B 3/0062* (2013.01); *B81C 99/002* (2013.01); *H01F 1/06* (2013.01); *H01F 1/083* (2013.01); *H01F 7/02* (2013.01); *H01F 41/0266* (2013.01)

(58) Field of Classification Search
None
See application file for complete search history.

(56) References Cited

U.S. PATENT DOCUMENTS 10,821,565 B2 * 11/2020 Liu .................... B81B 7/00
2012/0135237 A1   5/2012 Gracias et al.
(Continued)

OTHER PUBLICATIONS

Barbot, A. et al. On-chip Microfluidic Multimodal Swimmer toward 3D Navigation. Sci. Rep. 6, 19041; doi: 10.1038/srep19041, 1-8 (2016).
(Continued)

*Primary Examiner* — Kathryn Wright
(74) *Attorney, Agent, or Firm* — Seed Intellectual Property Law Group LLP

(57) ABSTRACT

A three-dimensional (3D) untethered mobile actuator having the following parts: (a) a substrate having two or more magnetized panels, and (b) a frame that connects the magnetized panels, the magnetized panels being made of a polymer with embedded permanent magnetic particles, each magnetized panel of the 3D untethered mobile actuator having a magnetic moment in a different direction than a next neighboring panel, and the 3D untethered mobile actuator having a structural configuration that changes between a substantially flat structural configuration in the absence of a magnetic field, and an actuated structural configuration when under influence of a magnetic field. Methods of manufacturing and using the 3D mobile actuator and a system that includes the 3D mobile actuator are provided.

27 Claims, 21 Drawing Sheets

(51) Int. Cl.
  *H01F 1/08* (2006.01)
  *B81B 3/00* (2006.01)
  *B81C 99/00* (2010.01)

(56) References Cited

U.S. PATENT DOCUMENTS

2014/0225694 A1* 8/2014 Sitti .................. F04D 29/426
                                                    335/295
2014/0249499 A1* 9/2014 Selaru ................ A61M 31/002
                                                    604/500
2017/0291819 A1* 10/2017 Cho et al. ............. C01B 31/043
2018/0360354 A1* 12/2018 Agarwal .................. H01P 7/00

OTHER PUBLICATIONS

Breger, J.C. et al. Self-Folding Thermo-Magnetically Responsive Soft Microgrippers. ACS Appl. Mater. Interfaces. 7, 3398-3405 (2015), United States of America.

Chung, S.E. et al. Three-dimensional heterogeneous assembly of coded microgels using an untethered mobile microgripper. Lab Chip. 15, 1667-1676 (2015).

Diller, E. et al. Remotely addressable magnetic composite micropumps. RSC Advances. 2, 3850-3856 (2012).

Diller, E. et al. Independent control of multiple magnetic microboots in three dimensions. The International Journal of Robotics Research 32: 5, 614-631 (2013).

Diller, E. et al. Continuously distributed magnetization profile for millimeter-scale elastomeric undulatory swimming. Appl. Phys. Lett. 104, 174101, 1-4 (2014). AIP Publishing LLC.

Diller, E. et al. Three-Dimensional Programmable Assembly by Untethered Magnetic Robotic Micro-Grippers. Adv. Funct. Mater. 24, 4397-4404 (2014).

Diller, E. et al. Six-degree-of-freedom magnetic actuation for wireless microbiotics. The International Journal of Robotics Research 35: 1-3, 114-128 (2015).

Kratochvil, B.E. et al. MiniMag: A Hemispherical Electromagnetic System for 5-DOF Wireless Micromanipulation. 1-13. Switzerland.

Kuo, J. et al. A hydrogel-based intravascular microgripper manipulated using magnetic fields. Sensors and Actuators A. 211, 121-130 (2014).

Mahoney, A. et al. Behaviour of rotating magnetic microrobots above the step-out frequency with application to control of multi microrobot systems. Applied Physics Letters. 104, 144101, 1-4 (2014).

Petruska, A.J. et al. Minimum Bounds on the Number of Electromagnets Required for Remote Magnetic Manipulation. IEEE Transactions On Robotics. 31: 3, 714-722 (2015).

Randhawa, J.S. et al. Pick-and-Place Using Chemically Actuated Microgrippers. J. Am. Chem. Soc. 130: 51, 17238-17239 (2008). United States of America.

Tasoglu, S. et al. Untethered micro-robotic coding of three-dimensional material composition. Nat. Commun. 5: 3124, 1-17 (2014).

Vasseur, P. et al. The lateral migration of spherical particles sedimenting in a stagnant bounded fluid. J. Fluid. Mech. 90: 3, 561-591 (1977). Great Britain.

Vasudev, A. et al. A capillary microgripper based on electrowetting. Appl. Phys. Lett. 9,103503, 1-3 (2008). United States of America.

Walker, R. et al. Particles manipulation using an ultrasonic microgripper. Appl. Phys. Lett. 101, 163504, 1-4 (2012). United States of America.

Yamanishi, Y. et al. Powerful actuation of magnetized microtools by focused magnetic field for particle sorting in a chip. Biomed Microdevices. 12, 745-752 (2010).

Ye, Z. et al. Micro-manipulation using rotational fluid flows induced by remote magnetic micro-manipulators. Journal of Applied Physics. 112, 064912, 1-7 (2012). United States of America.

Zhang, J. et al. Millimeter-Scale Magnetic Swimmers Using Elastomeric Undulations.

Zhang, J. et al. Independent Control of Two Millimeter-Scale Soft-Bodied Magnetic Robotic Swimmers.

* cited by examiner

1007

1008

1009

1010

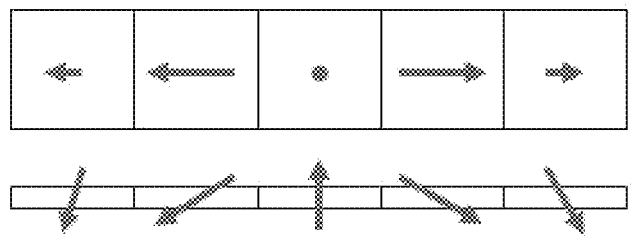
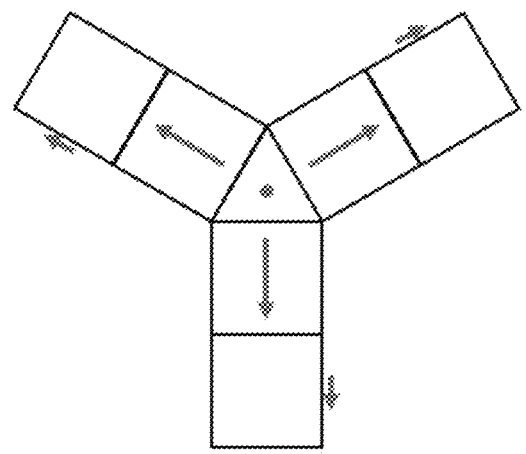
Fig. 15A　　　　　　　　　　Fig. 15B
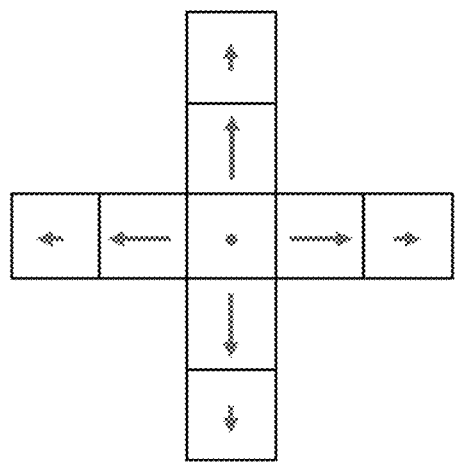
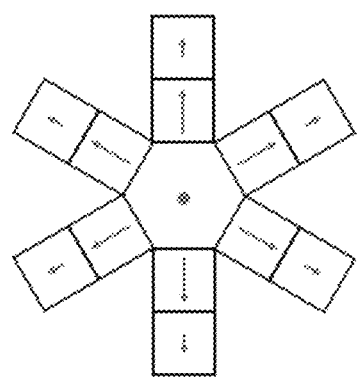
Fig. 15C　　　　　　　　　　Fig. 15D
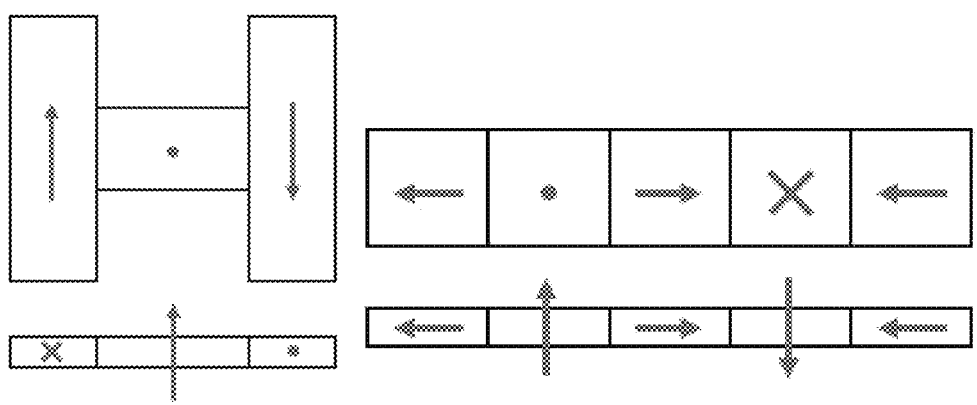
Fig. 15E　　　　　　　　　　Fig. 15F

MOBILE DEVICE FOR GRASPING AND ACTIVE RELEASE OF OBJECTS

This application claims priority of U.S. provisional application Nos. 62/516,891 filed on Jun. 8, 2017, the contents of which is incorporated herein by reference.

FIELD OF THE INVENTION

The present invention relates to micro and nano manipulation, micro and nanotechnologies, and automation at the micro and nano scales.

BACKGROUND OF THE INVENTION

Recent advancement of mobile microrobotics suggests new solutions for tasks in healthcare and micro-factory. One major challenge in microrobotics is the control and actuation of microrobots, which is not trivial considering that most microrobots do not have space for onboard power or electronic systems. Magnetic field is utilized to provide energy and controlling signals to microrobots, with its distinct advantages of being able to penetrate most materials, especially biological substances, and generate forces and torques on magnetic materials remotely and simultaneously. One disadvantage of magnetic field is that it cannot generate torques around the magnetic moment direction of the microrobot, limiting the maximum number of degree-of-freedom (DOF) of microrobot in three-dimensional (3D) space to be five. Nevertheless, this limitation has been partly solved by Diller et al when a non-uniform magnetization profile is achievable within the microrobot body, enabling full six-DOF actuation [1]. Additionally, the topic of powering and controlling multiple microrobots using a single magnetic field has been widely discussed and many mechanisms have been proposed [2-4]. These merits make magnetic field a popular choice in microrobotic tasks, including swimming [5, 6], microfluidic regulation [18, 7], and microobject manipulation [11, 13, 14]. The emerged magnetic microrobots have diverse forms and functionalities, among which the magnetic microgrippers attract much attention as a result of their promising applications in intravascular surgery [11] and micro-object manipulation and/or transportation [12-14]. Many of these magnetic microgrippers are made of soft elastic materials. These soft microgrippers are easy to fabricate, immune to damage, safe in biomedical applications, and capable of performing tasks using their deformable bodies. Although magnetic field can provide energy, other inputs such as thermal [15], chemical [16] and optical responses are often required to fully control a microgripper: exerting authorities over its orientation, shape, and position. For example, Breger et al proposed a soft-bodied microgripper with a tip-to-tip length of about 7 mm that is opened and closed by the environmental temperature change [15]. Involving other responses makes magnetic microgrippers more complex and less efficient. And some of these other responses are harmful to biological cells and tissues, compromising the bio-compatibility of these microgrippers. Efforts have been made to fully control microgrippers using only magnetic fields. Kuo et al designed a two-dimensional (2D) intravascular microgripper that uses magnetic field as its driving source and control signal [11]. Although this microgripper does not require any temperature change of its environment to work, its deformation still relies on a thermal response induced by the applied alternating magnetic field through the Nel and Brownian relaxation process. And it takes the microgripper ten or more seconds to close its grasping tips. Diller and Sitti presented two kinds of 2D tetherless soft-bodied microgrippers actuated by magnetic forces and magnetic torques, respectively [17]. Both kinds of microgrippers are made of soft elastomer with embedded magnetic particles, and fully controlled by magnetic effects without involving any other responses such as thermal or chemical actuation. The torque-based microgripper is successfully demonstrated to perform 3D microassembly. Further study shows this microgripper can pick and-place microgels into a 3D heterogeneous assembly with up to ten layers [12]. Nevertheless, these microgrippers are 2D and their deformation ranges are relatively small, limiting the geometry and dimension of the cargo they can securely grasp.

In summary, if an existing microgripper is 3D, it needs additional input besides magnetic fields. If an existing microgripper can be controlled using only magnetic field, this microgripper is 2D in geometry. The 2D microgrippers "pinch" cargoes, and therefore require cargoes to have a handle that matches the gripper tip. Without this handle, the grasping becomes much less reliable. As a result, the cargoes were specifically designed to demonstrate the grasping, and the 2D gripper cannot work with generic cargoes.

US Pat. Appl. Publ. No. 2012/0135237 describes self-folded cubes that could be assembled into larger 3D arrays using magnetic forces and hydrophobic/hydrophilic interactions. That is both magnetic forces and hydrophobic/hydrophilic interactions are needed to fold the cubes into 3D arrays. Furthermore, temperature is used to actuate the 3D device described in this patent application.

3D magnetic grippers that are not fully controlled by magnetic forces and torque suffer the following disadvantages: (a) Complicated setup and controller: in addition to the physical setup used to generate magnetic fields, these grippers also need a different set of apparatuses to provide the non-magnetic input used to activate them. Their controllers not only need to manipulate the magnetic field, but also they have to manage the other forms of input and consider the cooperation and interference between these two inputs. As a result, the controller is more sophisticated than the one that is only responsible for magnetic fields. (b) Poor biocompatibility. These grippers are often used to perform biological tasks, such as manipulate cells, capture biopsy samples, and deliver drugs inside the human body. The non-magnetic inputs used to activate the gripper actions often impair the gripper biocompatibility. Temperature changes and chemical reactions can be hazardous for biological environments and therefore dangerous for the creatures living within. Optical stimulus is not feasible when the gripper works in environments that are enclosed by opaque materials, e.g., the human body. (c) Lack of control over precise gripping force. The force achieved is a secondary effect. (d) Slow gripping motions. These grippers often work in aqueous mediums. Temperature changes and chemical reactions in aqueous media take time, and the microgrippers typically take several minutes top open or close. (e) Some of the existing gripper techniques can only go through a single open-closed cycle, preventing them from completing controlled procedures where multiple attempts might be required.

2D magnetic gripper that is fully controlled by magnetic fields suffer at least from the following limitation: Limitation in cargo that can be grasped. 2D grippers that simply "pinch" the cargo can only securely grasp the cargoes with certain precise shapes and sizes which match the gripper jaws geometry, due to the planar nature of the gripper structure. These 2D grippers also struggle to reliably carry cargo for the same reasons.

Devices of the prior art are made from "soft" magnets that do not retain their magnetization once a strong magnetizing field is applied and removed. Since these devices will not retain magnetization, they cannot be programmed. Some tricks have been achieved before such as aligning soft magnet particles to get some deformation in flexible devices (see Kim, J., et al., Nature Materials, Letters, published online Aug. 7, 2011) but these devices cannot have sophisticated motions programmed like a gripper closing completely. They are also much weaker in strength and require larger fields for actuation.

What is needed is a three-dimensional gripper that permits (1) easy, secured grasping of micro, nanometer-sized objects; (2) rapid, highly reproducible, accurate release of the objects; and (3) is fully wirelessly controlled (position, orientation, speed) and activated (opening, closing) exclusively by magnetic forces and torques and without involving (i.e. devoid of) other responses such as thermal and chemical actuation.

SUMMARY OF INVENTION

In one aspect of the present invention, a device for autonomous grasping nanometer or micrometer sized objects and performing active release of the objects is provided.

In one embodiment, the present invention is a three-dimensional (3D) untethered mobile actuator comprising the following parts: (a) a substrate having two or more magnetized panels, and (b) a frame that connects the magnetized panels, the magnetized panels being made of a polymer with embedded permanent magnetic particles, each magnetized panel of the 3D untethered mobile actuator having a magnetic moment in a different direction than a next neighboring panel, and the 3D untethered mobile actuator having a structural configuration that changes between a substantially flat structural configuration in the absence of a magnetic field, and an actuated structural configuration when under influence of a magnetic field.

In one embodiment, the present invention provides for a three-dimensional (3D) untethered mobile actuator. The 3D untethered mobile actuator, in one embodiment, includes the following parts: (a) a magnetized base panel having lateral sides, (b) at least one pair of magnetized limb panels, each limb of one pair extending from the lateral sides of the magnetized base panel, and (c) a frame that connects the each limb to the lateral sides of the magnetized base panel, the magnetized base panel and the magnetized limb panels being made of a polymer with embedded permanent magnetic particles, each part of the 3D untethered mobile actuator having a magnetic moment in a different direction, and the 3D untethered mobile actuator having a structural configuration that changes between a substantially flat structural configuration in the absence of a magnetic field, and a hollowed polyhedral structural configuration when under influence of a magnetic field.

In one embodiment of the 3D untethered mobile actuator of the present invention, the frame is a continuous frame that borders each of the magnetized base and limb panels and connects the magnetized limb panels to the magnetized base panel through joint structures.

In another embodiment of the 3D untethered mobile actuator of the present invention, the magnetized base panel has four lateral sides, and the 3D actuator comprises two pairs of limbs, each limb being connected to one lateral side of the magnetized base panel through the joint structures of the continuous frame.

In another embodiment of the 3D untethered mobile actuator of the present invention, at least one limb panel of the at least one pair of limb panels comprises (i) a magnetized arm panel having a first lateral side connected to the magnetized base panel through the frame, and a second lateral side opposite to the first lateral side, and (ii) a magnetized finger panel connected to the second lateral side of the magnetized arm panel through the frame.

In another embodiment of the 3D untethered mobile actuator of the present invention, the 3D actuator has a centrosymmetic four-limb structure with one magnetized base panel, four magnetized arm panels and four magnetized finger panels, each magnetized finger panel extending from one magnetized arm panel, wherein under the influence of the magnetic field, the 3D untethered mobile actuator forms a substantially cubical hollowed structure.

In another embodiment of the 3D untethered mobile actuator of the present invention, the 3D actuator has a centrosymmetic four-limb structure with one magnetized base panel, four magnetized arm panels and one magnetized finger panel extending from one of the four magnetized arm panels, wherein under the influence of the magnetic field, the 3D untethered mobile actuator forms a substantially cubical hollowed structure.

In another embodiment of the 3D untethered mobile actuator of the present invention, the magnetized finger panel includes a free end.

In another embodiment of the 3D untethered mobile actuator of the present invention, the magnetized base panel and the magnetized arm panel are quadrilateral, and the magnetized finger panel is trilateral or quadrilateral.

In another embodiment of the 3D untethered mobile actuator of the present invention, the at least one pair of magnetized limb panels are not connected to one another.

In another embodiment of the 3D untethered mobile actuator of the present invention, the frame is non-magnetized and made of the flexible elastomer devoid of magnetic materials.

In another embodiment of the 3D untethered mobile actuator of the present invention, the magnetized base panel and the magnetized limb panels are made of a substantially stiff polymer with the embedded permanent magnetic particles, and the frame being made of a flexible elastomer.

In another embodiment of the 3D untethered mobile actuator of the present invention, the mass ratio of permanent magnetic particles to polymer is between about 1:10 to 2:1.

In another embodiment of the 3D untethered mobile actuator of the present invention, the mass ratio of permanent magnetic particles to polymer is 1:1.

In another embodiment the present invention provides for a method of manufacturing the 3D untethered mobile actuator of the present invention. In one embodiment, the method includes: (a) providing negative molds for each of the base and limb panels and a negative mold for the frame; (b) pouring a mixture of a first polymer with permanent magnetic particles into the negative molds to form the base and limb panels; (c) magnetizing the base and limb panels; (d) placing the magnetized base and limb panels in the mold for the frame and pouring a second polymer to connect neighbouring magnetized panels; and (e) removing the 3D untethered mobile actuator from the mold for the frame, thereby providing the 3D untethered mobile actuator.

In one embodiment of the method of manufacturing the 3D untethered mobile actuator of the present invention, the base and limb panels are magnetized based on their position in the 3D untethered mobile actuator such that the base panel and each of the limb panels has a magnetic moment in a different direction and the 3D untethered mobile actuator closes when a magnetic field is applied.

In another embodiment of the method of manufacturing the 3D untethered mobile actuator of the present invention, the magnetizing of step (c) comprises (i) mounting the panel to be magnetized on a stage at a predefined tilting angle β, and (ii) exposing the panel to a uniform magnetic field, wherein the tilting angle β is a tilting angle of the panel with respect to the applied uniform magnetic field In another embodiment of the method of manufacturing the 3D untethered mobile actuator of the present invention, the tilting angle β is selected to close the 3D untethered actuator in an applied magnetic field along a central axis of the 3D untethered actuator.

In another embodiment of the method of manufacturing the 3D untethered mobile actuator of the present invention, the tilting angle β for the base is −90°, the tilting angle β for the magnetized arm panel is 25°, and the tilting angle β for the magnetized finger panel is 80°.

In another embodiment of the method of manufacturing the 3D untethered mobile actuator of the present invention, the second polymer is relatively more flexible than the first polymer.

In another embodiment of the method of manufacturing the 3D untethered mobile actuator of the present invention, the frame is devoid of magnetic particles.

In another embodiment of the method of manufacturing the 3D untethered mobile actuator of the present invention, the mass ratio of permanent magnetic particles to first polymer is between about 1:10 to 2:1.

In another embodiment of the method of manufacturing the 3D untethered mobile actuator of the present invention, the mass ratio of permanent magnetic particles to first polymer is 1:1.

In another embodiment the present invention provides for a method of actuating the 3D untethered mobile actuator of the present invention, the method, in one embodiment, includes exposing the 3D untethered mobile actuator to a magnetic field that exerts a force and a torque on the actuator thereby actuating the 3D untethered mobile actuator.

In one embodiment of the method of actuating the 3D untethered mobile actuator of the present invention, the magnetic field is a non-uniform magnetic field or a rotating field to roll the actuator on a surface.

In one embodiment of the method of actuating the 3D untethered mobile actuator of the present invention, the 3D untethered mobile actuator is actuated solely by the magnetic field without other forms of input.

In another embodiment, the present invention relates to a system for autonomous manipulation of a actuator, the system, in one embodiment, includes: (a) the 3D untethered mobile actuator of any of the previous embodiments, (b) one or more electromagnetic coils so arranged as to generate a magnetic force on the 3D untethered mobile actuator, and (c) a computer linked to the one or more electromagnetic coils, the computer including a processor having instructions to regulate the applied magnetic force on the 3D untethered mobile actuator.

In one embodiment of the system of the present invention, the system further includes a feedback means for tracking the 3D untethered mobile actuator and generating feedback information based on said tracking, the feedback means being in communication with the computer, and wherein the processor includes instructions to regulate the applied magnetic force based on the feedback information from the feedback means.

In another embodiment, the present invention is a method of manufacturing the 3D untethered mobile Actuator. The method includes, in one embodiment: (a) providing a substrate having a layer comprising a mixture of pre-magnetized magnetic particles and UV-curable polymers; and (b) successively orienting the pre-magnetized magnetic particles with a magnetic field and selectively curing regions of the layer with UV light.

In one embodiment of the method according to the previous embodiment, step (b) comprises: (i) exposing the layer to an applied magnetic field in a first magnetization direction; (ii) curing with UV selected first areas of the substrate such as the selected first areas retain the magnetization into the first magnetization direction; (c) rotating the applied field to a second magnetization direction and exposing the layer to the second magnetization direction; (d) polymerizing selected second areas of the layer such that the second selected second areas retain the magnetization into the second magnetization direction; and (e) optionally repeating steps (a) to (d) for other areas; thereby producing a 3D untethered mobile actuator.

In one embodiment according to any one of the previous embodiments, the 3D untethered mobile actuator is a 3D untethered mobile microgripper.

BRIEF DESCRIPTION OF THE DRAWINGS

A detailed description of one or more embodiments is provided herein below by way of example only and with reference to the following drawings, in which:

As shown in FIG. 4B, frames from the top-view and side-view cameras are processed to extract the centroids of the 3D microgripper and the cargo. The working principles of the coil system is depicted in FIG. 4C. Magnetic field is generated in the workspace when one or more coils are powered. The resultant magnetic field is uniform only when the currents in the same coil pair have identical amplitude and direction. All other configurations lead to non-uniform field and nonzero field gradient. Coils with current are marked as dark grey fill and the density of small arrows denotes the resultant field strength.

Figures 1A, 1B:
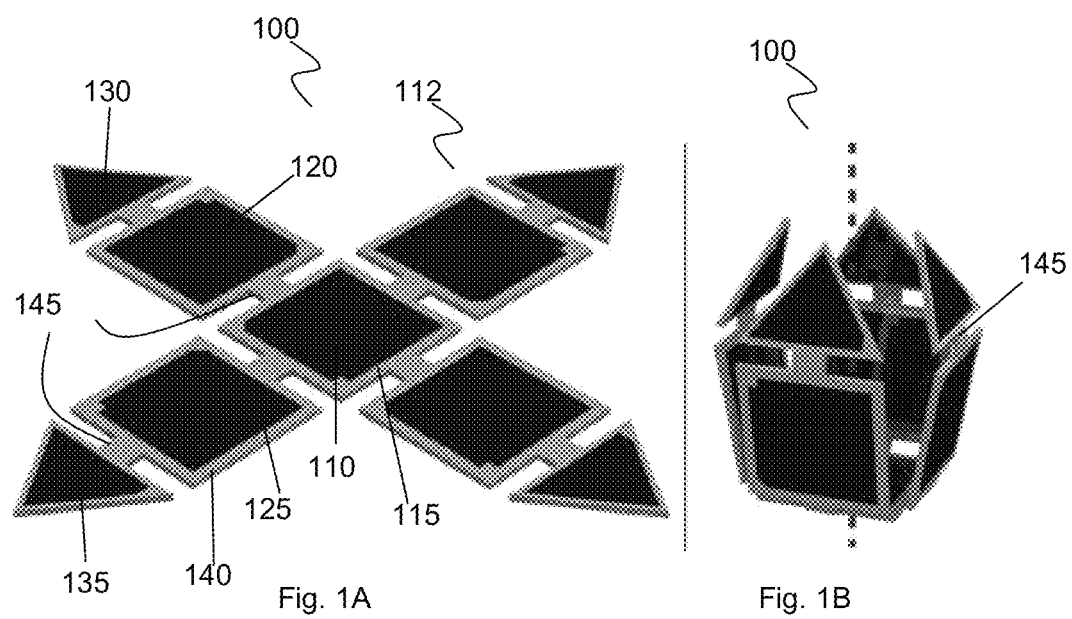
FIG. 1A illustrates a microgripper according to one embodiment of the present invention in the absence of a magnetic field.
FIG. 1B illustrates a 3D microgripper of FIG. 1A under magnetic influence.

In the drawings, one or more embodiments of the present invention are illustrated by way of example. It is to be expressly understood that the description and drawings are only for the purpose of illustration and as an aid for understanding, and are not intended as a definition of the limits of the present invention.

DETAILED DESCRIPTION OF THE INVENTION

Definitions

Following long-standing patent law convention, the terms "a," "an," and "the" refer to "one or more" when used in this application, including the claims. Thus, for example, reference to "a subject" includes a plurality of subjects, unless the context clearly is to the contrary (e.g., a plurality of subjects), and so forth. The term "plurality" as used herein means "one or more." All publications cited in this document are incorporated herein by reference.

Throughout this specification and the claims, the terms "comprise," "comprises," and "comprising" are used in a non-exclusive sense, except where the context requires otherwise. Likewise, the terms "include", "has" and their grammatical variants are intended to be non-limiting, such that recitation of items in a list is not to the exclusion of other like items that can be substituted or added to the listed items.

For the purposes of this specification and appended claims, unless otherwise indicated, all numbers expressing amounts, sizes, dimensions, proportions, shapes, formulations, parameters, percentages, parameters, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some embodiments, ±100% in some embodiments ±50%, in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed methods or employ the disclosed compositions.

Further, the term "about" when used in connection with one or more numbers or numerical ranges, should be understood to refer to all such numbers, including all numbers in a range and modifies that range by extending the boundaries above and below the numerical values set forth. The recitation of numerical ranges by endpoints includes all numbers, e.g., whole integers, including fractions thereof, subsumed within that range (for example, the recitation of 1 to 5 includes 1, 2, 3, 4, and 5, as well as fractions thereof, e.g., 1.5, 2.25, 3.75, 4.1, and the like) and any range within that range.

"Actuator" refers to a device for carrying out an activity on something, such grasping, moving or controlling something. A "microgripper" is an actuator for grasping something.

"Limb" refers to an arm and a finger extending from the arm.

A "tethered" gripper, or more generally speaking, a "tethered" device, is a device that has a cable or cord attached to it. This cable/cord is used to transfer power and control signals to the device. The considerable number of robots at the meter-scale are "tethered". "Untethered" is a synonym of "wireless". In microrobotics the word "untethered"/"tetherless" is preferred over "wireless".

A "neighboring panel" means with respect to a reference panel, the panel that is immediately next to the reference panel (i.e. there are no other panels in between).

Overview

For the first time, an autonomous, untethered, 3D microgripper for micrograsping and cargo delivery using simple controllers and limited feedback is presented. The microgripper position, orientation, and grasping are controlled autonomously and independently. The grasping, reliability and versatility of the microgripper of the present invention are demonstrated and characterized with cargoes of varying geometries and dimensions. The 3D microgripper of the present invention works with limited feedback, which is a ubiquitous issue in such manipulation tasks. Regulating the magnetic force, the controller can also manipulate the microgripper speed. Unlike microgippers of the prior art, the 3D microgripper of the present invention is fully controlled by magnetic fields, without the need of other forms of input such as thermal, optical or chemical inputs that are used to move the microgrippers. As such, the 3D microgrippers of the present invention are devoid of inputs other than magnetic fields. Unlike the grippers of the prior art, the 3D microgipper of the present invention does not use self-assembly to fold the structure, but rather is magnetically-driven and reversible so that the gripper can open into a flat configuration in the absence of a magnetic field (neutral state), it can close into a hollowed form, such as a hollowed polyhedral structure in the presence of a magnetic field (actuated state), and it can open again into the flat configuration when the magnetic field is removed.

The entire 3D microgripper of the present invention or parts thereof, is or are made from permanent magnets (also called "hard" magnets). Permanent magnets differ from non-permanent (soft) magnets in that they retain their magnetization once a strong magnetizing field is applied and removed. The incorporation of permanent magnets into selected parts or the entire 3D microgripper allows to magnetically "program" the device of the present invention during the fabrication process, with the beta values shown in FIG. 1E with arrows. Once fabrication and magnetization are complete, each segment of the device will retain its magnetization direction.

The 3D Microgripper

A three-dimensional (3D) untethered mobile actuator includes the following parts: (a) a substrate having two or more magnetized panels, and (b) a frame that connects the two or more magnetized panels. The two or more magnetized panels being made of a polymer with embedded permanent magnetic particles. Each magnetized panel of the 3D untethered mobile actuator having a magnetic moment in a different direction than a neighboring panel, and the 3D untethered mobile actuator having a structural configuration that changes between a substantially flat structural configuration in the absence of a magnetic field, and an actuated structural configuration when under influence of a magnetic field. In one aspect of the present invention, the 3D untethered mobile actuator is a 3D untethered mobile microgripper.

FIG. 1 illustrates an embodiment of 3D microgrippers of the present invention. With reference to FIG. 1A and FIG. 1B, the 3D microgripper of the present invention has a symmetric 3D structure. The 3D microgripper 100 includes a base 110, and at least two limbs 112. The limbs 112 can include arms 120 and fingers 130. The arms 120 and fingers 130 are allocated evenly as identical and orthogonal limbs around the base 110 that is at the geometric center of the 3D microgripper 100.

FIG. 1A illustrates a particular embodiment of a 3D untethered mobile magnetic microgripper in a flat or open configuration having: (a) a magnetized base panel 110 having lateral sides 115, (b) magnetized arm panels 120, each lateral arm panel having pairs of opposing lateral sides 125, (c) magnetized finger panels 130 having lateral sides 135, and (d) a frame 140 that connects each arm panel 120 to one lateral side 115 of the base panel 120 and to one lateral side 135 of one finger panel 130 through one pair of opposing lateral sides 125. The frame 140 may be a continuous frame that borders the lateral sides of all of the panels of the microgripper.

FIG. 1B illustrates a microgripper in a closed configuration forming a 3D shape in an applied magnetic field according to one embodiment of the present invention. The dashed line represents the central axis of the 3D microgripper.

In the embodiment illustrated in FIGS. 1A-B, the microgripper 100 has a centrosymmetric four-limb structure with one base 110, four arms 120, four fingers 130, and a frame 140 connecting neighboring parts through joint structures 145. It should be understood that more or less than 4 arms and fingers are possible. For example, FIGS. 1G-H illustrate a design with one base 11, four arms $12a,b,c,c$ and one finger 13 attached to one of the four arms $12a,b,c,d$, and a frame 14 connecting the panels through joints 15.

The dimensions of the 3D microgripper of the present invention can vary. For example the microgripper 100 may be 3.5 mm long from tip-to-tip and 30 µm thick. The microgripper 100 forms an approximate 700 µm cube when fully closed.

Figure 14:
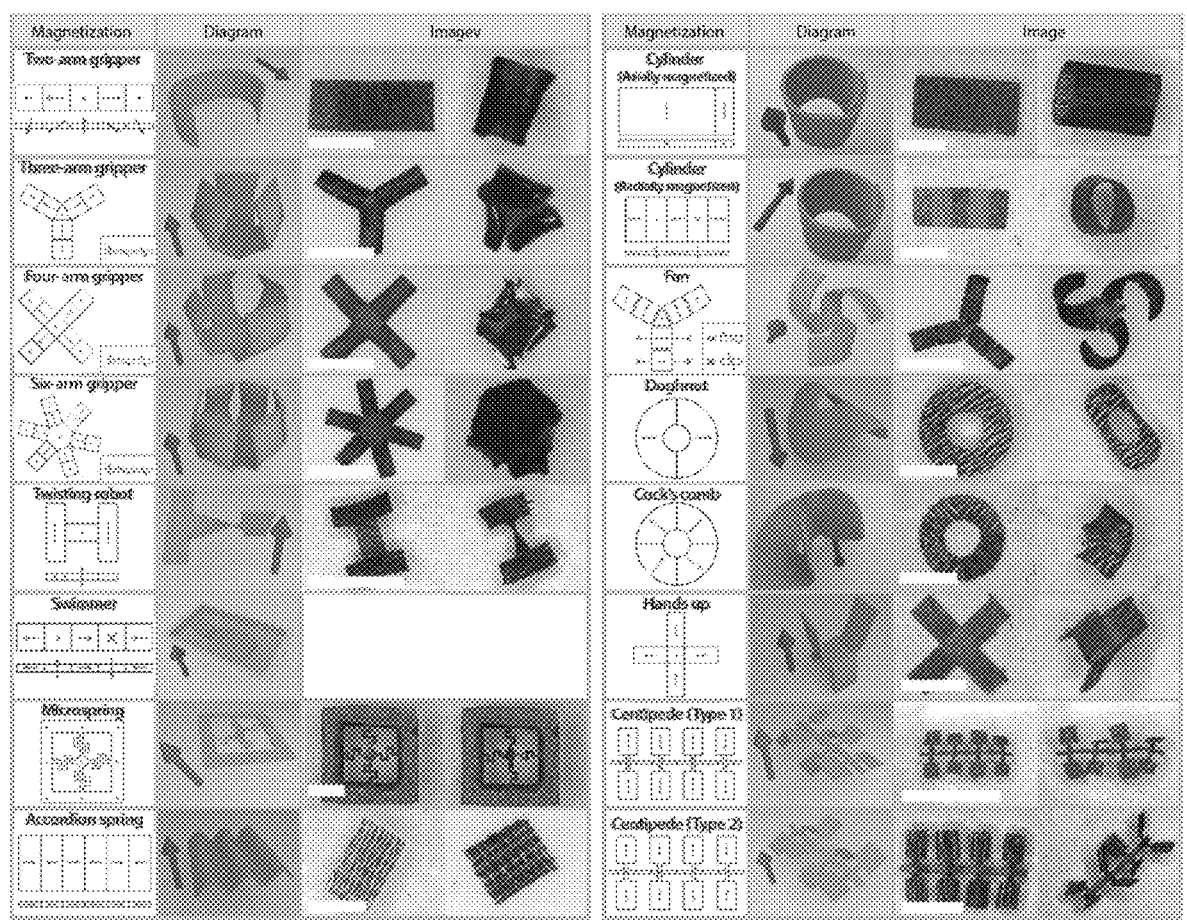
FIG. 14 illustrates a library of some soft-bodied magnetic actuators fabricated using the method described in Example 6. (Scale bar 2 mm.) Each fabricated device is shown in the neutral state (no field applied) and the actuated state (with field strength approximately 40 mT applied) (Some requires 40 mT but most of them require less than 5 mT).
Figure 15G:
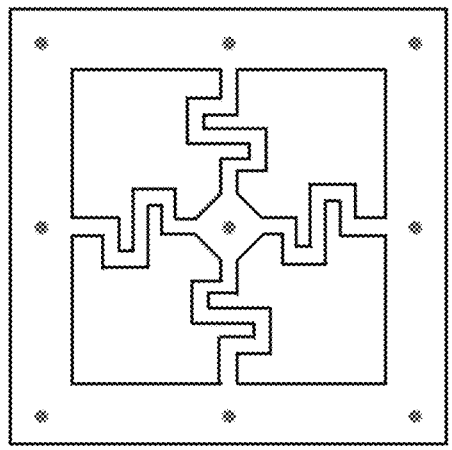
FIGS. 15A-15P illustrate the library of magnetic actuators depicted in FIG. 14.
Figure 15H:
Figure 15I:
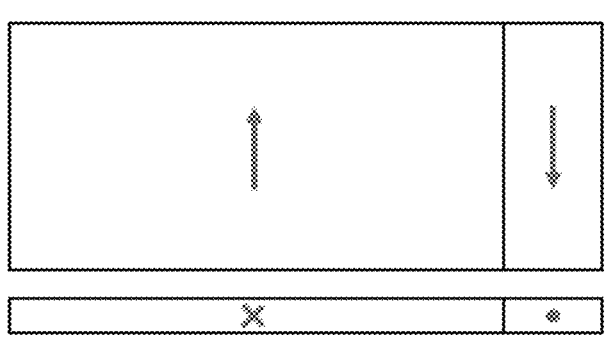
Figure 15J:
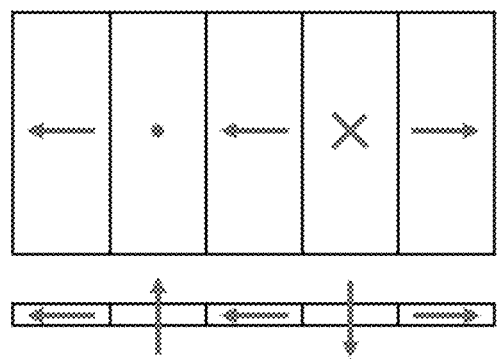
Figure 15K:
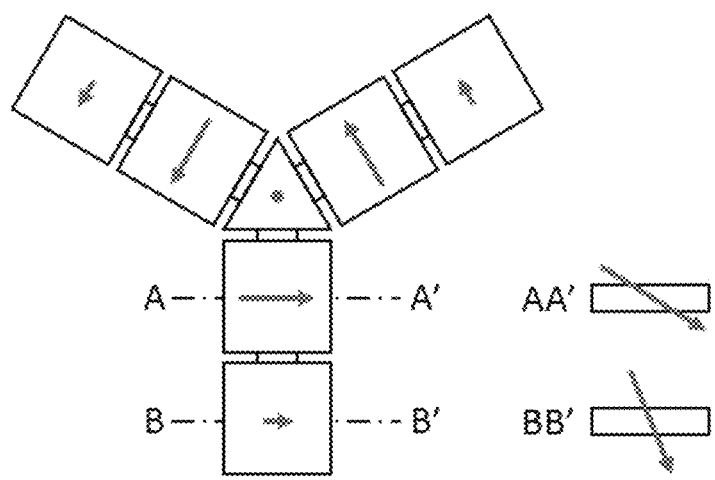
Figure 15L:
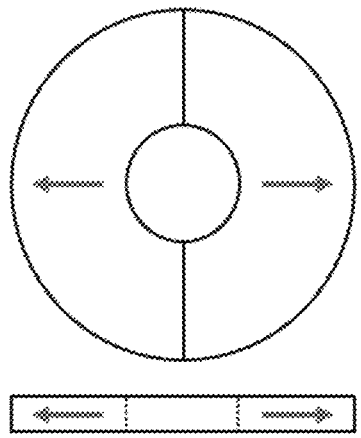
Figure 15M:
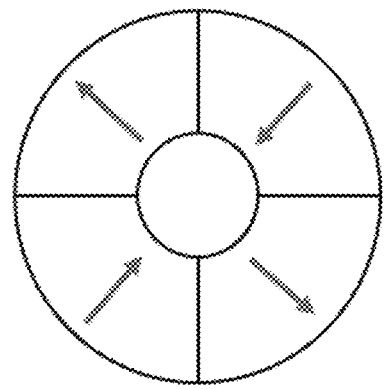
Figure 15N:
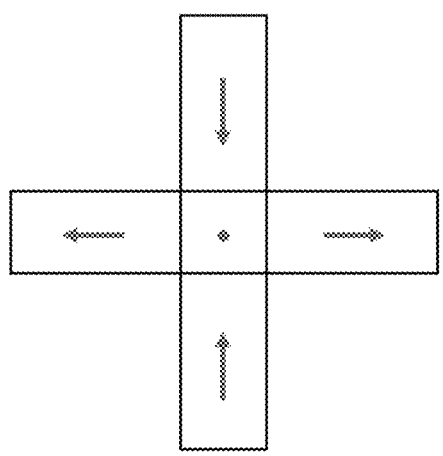
Figure 15O:
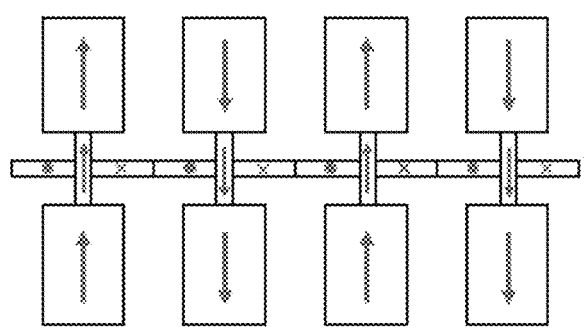
Figure 15P:
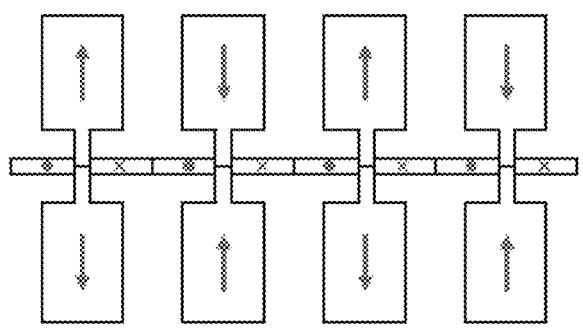

FIG. 14 and FIGS. 15A-P illustrate further embodiments of the 3D actuators of the present invention: two-arm gripper (FIG. 15A), three-arm gripper (FIG. 15B), four-arm gripper (FIG. 15C), six-arm gripper (FIG. 15D), twisting robot (FIG. 15E), swimmer (FIG. 15F), microspring structure (FIG. 15G), cylinder (axially (FIG. 15H) and radially (FIG. 15J) magnetized), fan (FIG. 15K), doughnut (FIG. 15L), cock's comb (FIG. 15M), hands up structure (FIG. 15N), type 1 centipede (FIG. 15O), and type 2 centipede (FIG. 15P).

The base panel, the finger panels and the arm panels are made of a polymeric elastomer material having embedded permanent magnetic particles. The elastomer material may be a relatively stiff elastomer, such as a silicone elastomer material like Sylgard 184, Dow Corning. The embedded permanent magnetic particles may be MQFT-15-7, NdPrFeB, Magnequench. Other materials may include samarium-cobalt, ferrite, and alnico to name a few. Theoretically, the ratio of the embedded permanent magnetic particles and the polymer of the panels can be any value. If the amount of permanent magnetic particles is too low, then a stronger magnetic field may be needed to realize the same controlling. Vice versa, more permanent magnetic particles means that one would only need a weaker magnetic field to control the microgripper. The permanent magnetic particles and the relatively stiff elastomer may be mixed at a mass ratio range between 1:10 to 2:1 (permanent magnetic particle to elastomer). Outside this range, the magnetic characteristics of the device of the present invention may be too weak for the setup to control it or the permanent magnetic particles may be so many that uniform mixing is hard to achieve. In one particular embodiment, the mass ratio is 1:1.

The frame is made of a polymer that can be a relatively flexible elastomer and may be devoid of magnetic materials or it may include permanent magnetic materials such as MQFT-15-7, NdPrFeB, Magnequench. An example of a flexible elastomer is Ecoflex 00-50, Smooth-On.

The material used for the frame is preferably soft to allow bending, but not that soft, so that the gripper can apply certain forces on its cargo. The gripper basically can use any elastic polymer that has a suitable, effective stiffness. Some appropriate polymers include: For panels (base, arm, finger, mixed with magnetic particles): polyurethane polymer (BJB M-3184); Mold Max series from Smooth-On Polydimethylsiloxane (PDMS, Sylgard 184 from Dow Corning) GC3D-EBE; Poly(ethylene glycol) diacrylate mixed with diphenyl (2,4,6-trimethylbenzoyl)-phosphine oxide (TPO). For frame (joints connecting panels), polymers include: Ecoflex series from Smooth-On; Polydimethylsiloxane (PDMS, Sylgard 184 from Dow Corning); GC3D-EBE; Poly(ethylene glycol) diacrylate mixed with diphenyl (2,4,6-trimethylbenzoyl)-phosphine oxide (TPO).

The gripper of the present invention relies on the direction of magnetization of its different parts, i.e. the base panel, the limb panels, and so forth.

In an applied magnetic field, the panels of the microgripper of the present invention experience magnetic forces and torques and work as the 'bones and muscles' of the microgripper. The flexibility of the frame makes it easy to bend and suitable for the functionality of 'soft joints' giving the dexterity of opening and closing reversibly in the 3D space in direct response to an applied magnetic field. When the frame is devoid of magnetic materials, the frame will not respond to magnetic fields and only the panels will experience forces and torques in magnetic fields, receiving energy and control signals. Consequently, the 3D microgripper of the present invention possesses the necessary stiffness to securely grasp its cargo and the required flexibility to deform easily in magnetic field.

Manufacturing and Magnetization

Figure 1C:
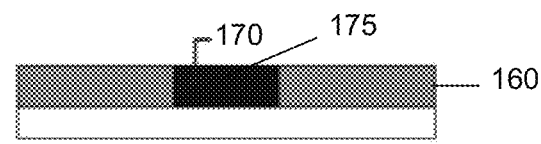
FIG. 1C illustrates cross sectional view of a negative mold for a panel of the 3D microgripper.
Figure 1D:
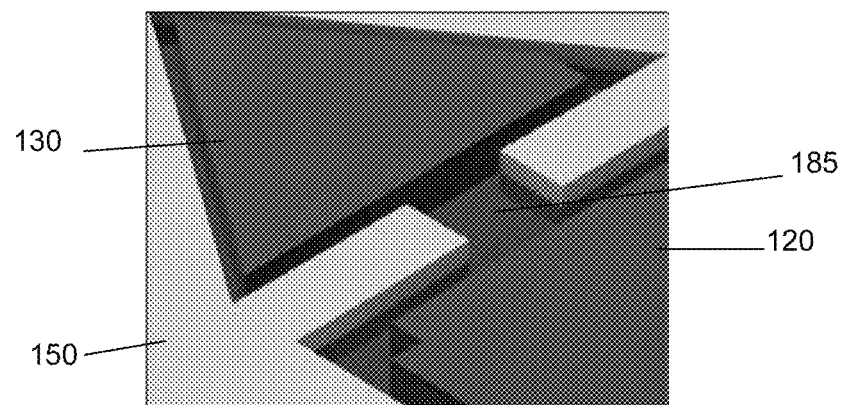
FIG. 1D illustrates top perspective view of a negative mold for the frame of the 3D microgripper with the finger and arm panels of the 3D microgripper in place.
Figure 1E:
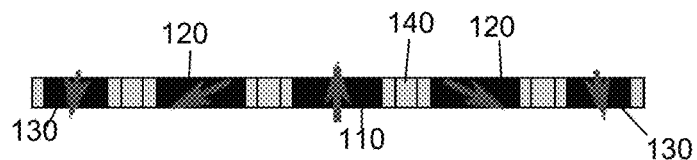
FIG. 1E illustrates a cross sectional view of a 3D microgripper showing the magnetization (arrows) profiles of the panels. The magnetization profile of each panel depends on the position of the panel in the 3D microgripper.

FIG. 1C and FIG. 1D show the fabrication process of a gripper depicted in FIG. 1A according to one embodiment of the present invention. The fabrication of the microgripper of the present invention includes the following steps. First, negative molds 160 are made for the blocks 175 (the block 175 represents the panels 110, 120, 130 of the microgripper 100) and the frame 140 using photolithography (SU-8 2025, MicroChem Corp.) on silicon wafers. Second, a polymer, which can be a relatively stiff silicone elastomer material (Sylgard 184, Dow Corning), is mixed homogeneously with permanent magnetic particles (MQFP-15-7, NdPrFeB, Magnequench) at a suitable mass ratio between 1:10 to 2:1, for example 1:1, as described before, after which this mixture 170 is poured into the molds 160 for blocks 175 (FIG. 1C). After this mixture 170 has cured, the blocks 175 are taken out from their molds 160 and magnetized differently based on their positions in the microgripper.

Figure 1F:
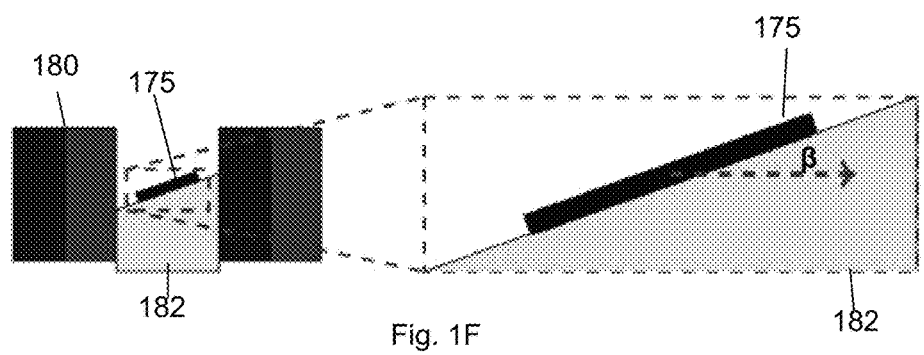
FIG. 1F illustrates two permanent magnets that create a strong uniform magnetic field that magnetize the magnetic particles of a panel mounted on an acrylic stage at a predetermined tilting angle.
Figure 1G:
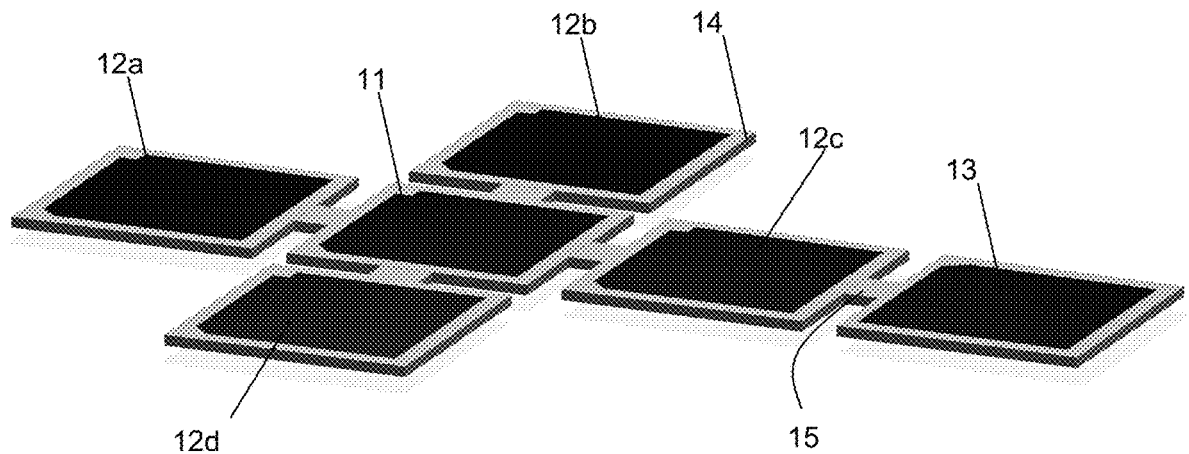
FIG. 1G illustrates a microgripper according to another embodiment of the present invention in the absence of a magnetic field.
Figure 1H:
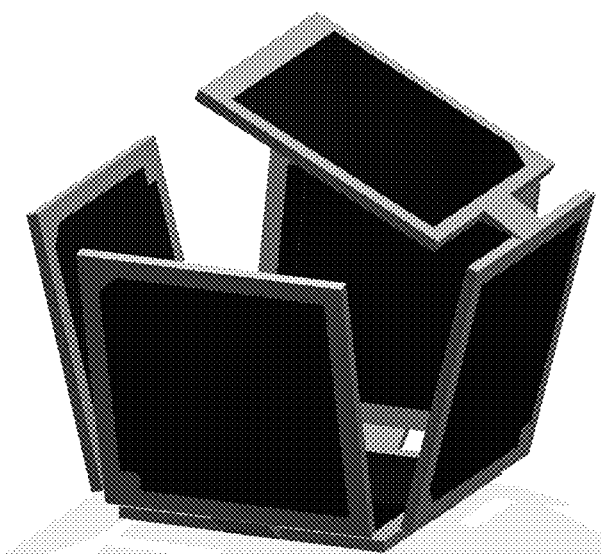
FIG. 1H illustrates the 3D microgripper of FIG. 1G under magnetic influence.

The blocks or panels 175 may be magnetized with any suitable methods. For example, the blocks can be magnetized in an MRI machine, or a pulsing electromagnetic coil system (high currency run through the coil in a very short time). With reference to FIG. 1F, two permanent magnets 180 (N40, Magnet4US) creates a strong uniform magnetic field in the gap between them (FIG. 1F). The gap between the permanent magnets 180 may be suitable to create a strong uniform magnetic field in the gap between them. For example, at a minimum the gap is the size of the blocks to be magnetized. Of course, the gap can be increased with bigger, stronger magnets. At least about 0.5 Tesla may be needed to magnetize the blocks of the microgripper of the present invention. Higher magnetizing field would make the 3D gripper of the present invention stronger. The material of the blocks may saturate at around 2.5 Tesla, and a stronger field may not help more after that. In the example of FIG. 1F, the gap is of 3 mm, and the magnets create a magnetic field of 1.1 T. For magnetization, a block/panel 175 is mounted on an acrylic stage 182 at a predefined tilting angle $\beta$, and then inserted into the strong magnetic field.

Figure 1I:
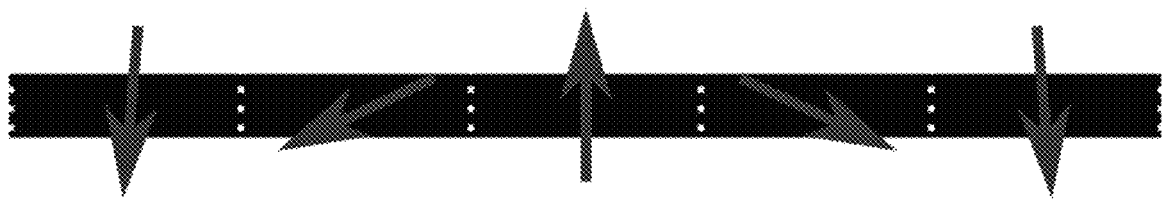
FIG. 1I illustrates a cross sectional view of a 3D microgripper with a magnetized frame showing the magnetization (arrows) profile of the panels in the absence of a magnetic field.

The permanent magnetic particles in the block 175 are magnetized, resulting in constant magnetization across the block's 175 body. The tilting angle $\beta$ equals to the angle from a block's 175 surface to its magnetization and is therefore referred to as the magnetization angle $\beta$. The $\beta$ angles are chosen to close the microgripper in an applied magnetic field along the central axis. For example, the magnetization angle $\beta$: $\beta_{base}=-90°$, $\beta_{arm}=250$, and $\beta_{finger}=800$ (FIG. 1F). The magnetization of each panel of the microgripper is shown by the arrows in FIGS. 1E and 1I. Before the magnetic field is applied, the microgripper is in a neutral state, flat (open) and the panels' magnetic moments neutralize each other, as shown in FIGS. 1E and 1I.

Figure 1J:
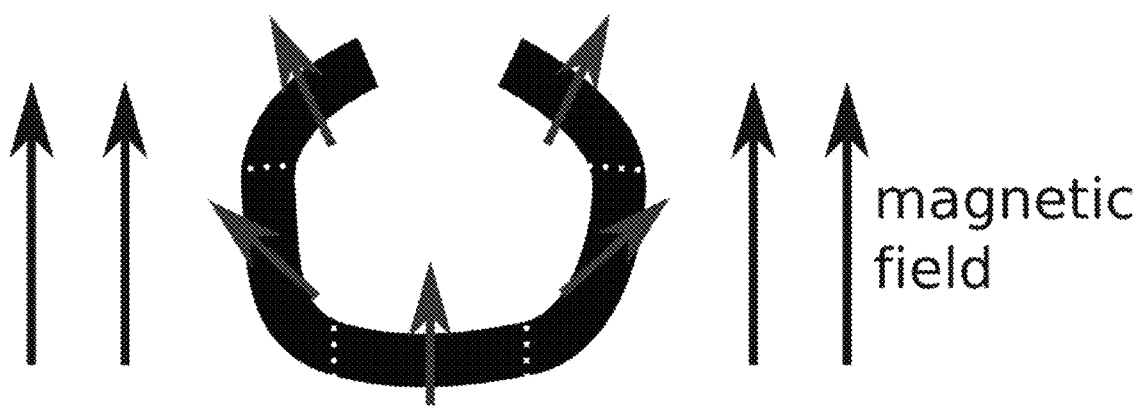
FIG. 1J illustrates the cross sectional view of FIG. 1I in the presence of a magnetic field.

Third, the magnetized blocks/panels 175 are placed in the mold 150 for the frame 140 (FIG. 1D), and a polymer, for example a flexible elastomer (Ecoflex 00-50, Smooth-On) fills the space 185 of this mold 150 to connect neighboring blocks thereby creating the frame 140 and the joints 145. After the frame has cured, the microgripper is taken out from the mold 150, for example manually using tweezers, or hands-free using a robot. The flexible elastomer used for the frame may or may not be mixed with magnetized particles. FIG. 1I and FIG. 1J illustrate the embodiment in which the frame includes permanent magnetized particles.

In another embodiment, the present invention provides for a manufacturing procedure or method that allows creating a wider variety of shapes or 3D microgrippers in a more automated process.

In this embodiment, the method of manufacturing the 3D untethered mobile microgripper, includes: (a) providing a substrate having a layer comprising a mixture of magnetic particles and UV-curable polymers; and (b) successively orienting the magnetic particles with a magnetic field and selectively curing regions of the layer with UV light.

Figure 9A:
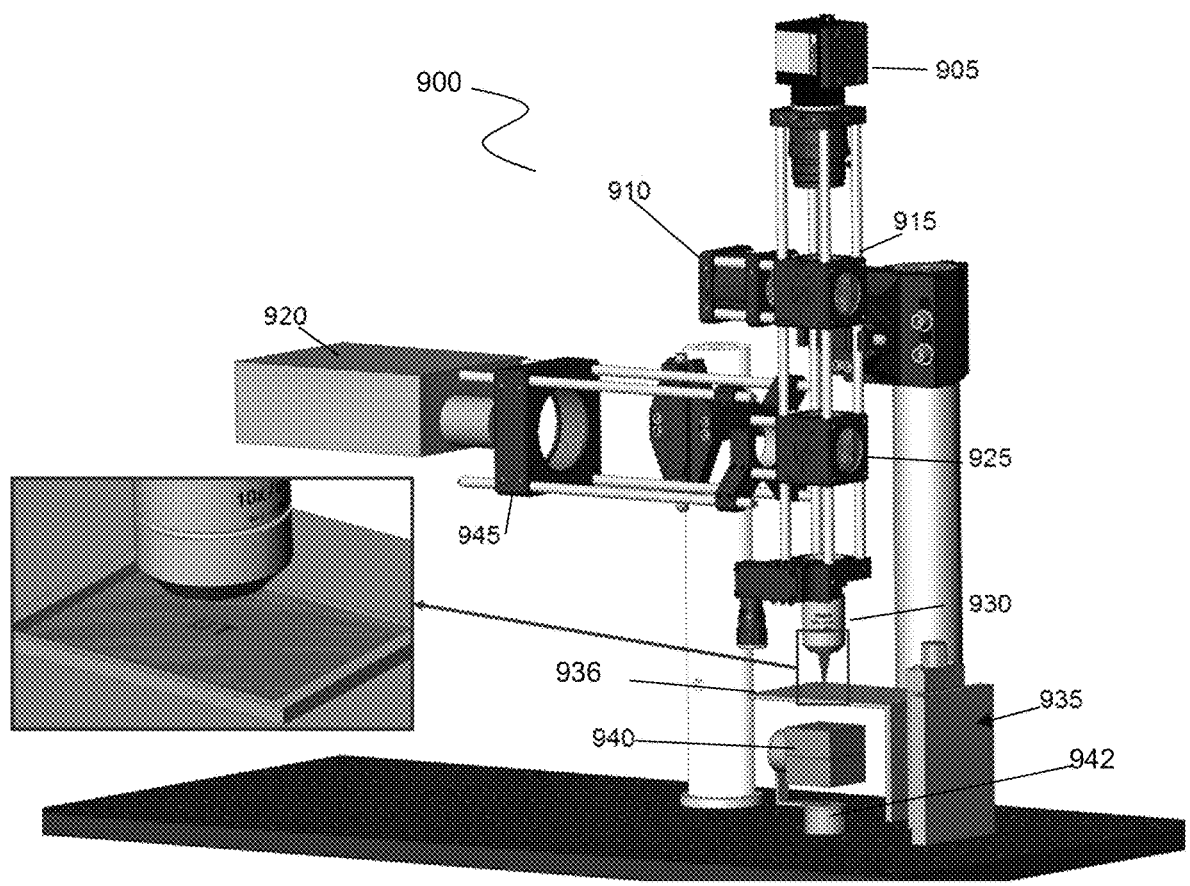
FIG. 9A is an illustration of the system for lithography-based fabrication.

FIG. 9 depicts a fabrication set up or system for producing a soft-bodied (to avoid confusion with "soft magnets") magnetic microrobot. The system 900 includes a camera 905, such as a CMOS camera, a source of white light 910, a first beamsplitter 915 for directing the white light to an objective lens 930, a UV projector 920, a second beamsplitter 925 for directing the UV emanating from the projector 920 to the objective lens, the objective lens 930, a precision stage 935 for supporting a substrate, and a permanent magnet 940 held by a 2 DOF robotic arm 942. A plano convex lens 945 (such as a Φ2" plano-convex lens) may be located between the UV projector and the second beamsplitter. The camera 905, the white light source 915, the projector 920, the precision stage 935 such as a vertical stage, and the 2 DOF robotic arm may be linked to a host computer having control algorithms for automatically controlling the different parts of the system 900 such as to automatize the entire fabrication process.

Figure 9B:
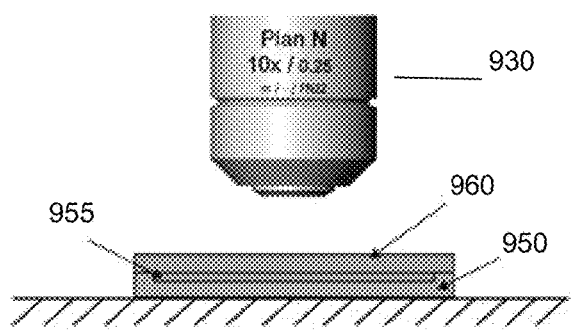
FIG. 9B is an illustration of the fabrication workspace showing lens which focuses light pattern onto a wafer which is coated with a thin layer of magnetic particles mixed with photopolymer.

FIG. 9B illustrates a substrate including a silicon wafer 950, a layer 955 comprising a mixture of magnetic particles and photopolymers, and a cover slip 960 covering the layer 955.

The individual magnetic dipoles in the polymer are rotated by the applied external field. Next, two pixels are cured in place by UV light. Those cured pixels retain their magnetization direction while the applied field rotates to a new direction. The process is repeated to create a final structure with programmed magnetization.

Figure 10:
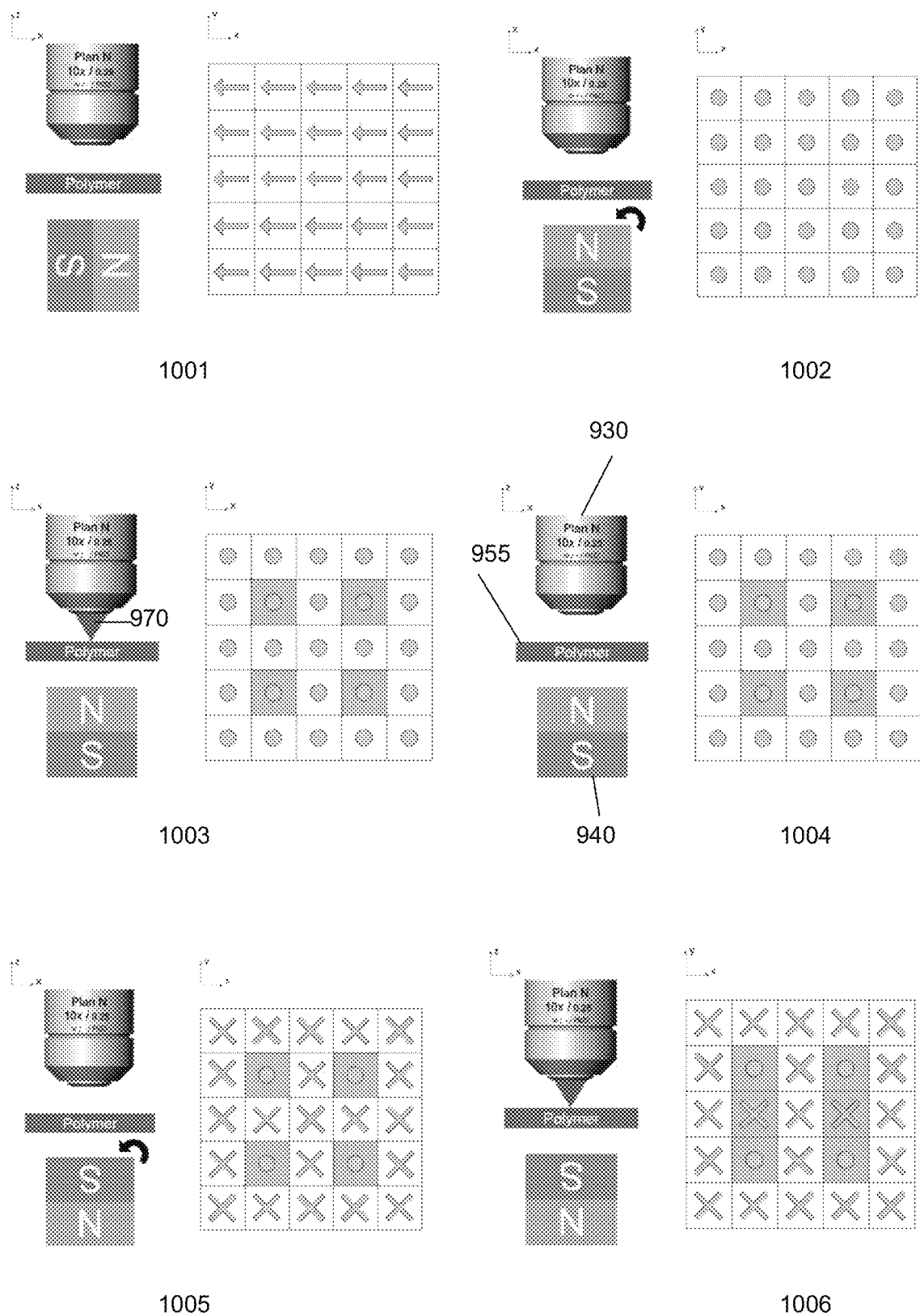
FIG. 10 illustrates the steps in an example patterning procedure according to one embodiment of the present invention.
Figure 10:
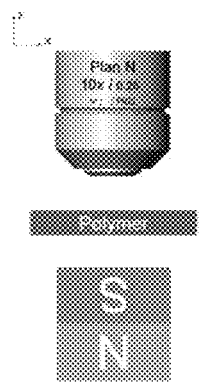
Figure 10:
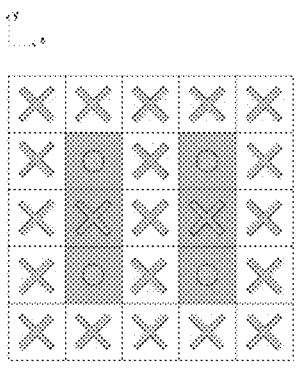
Figure 10:
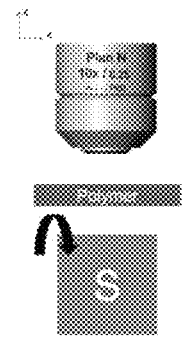
Figure 10:
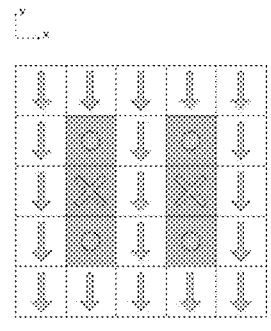
Figure 10:
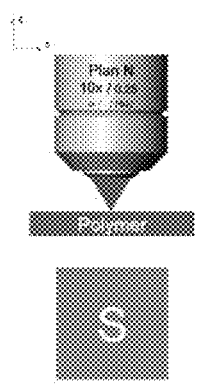
Figure 10:
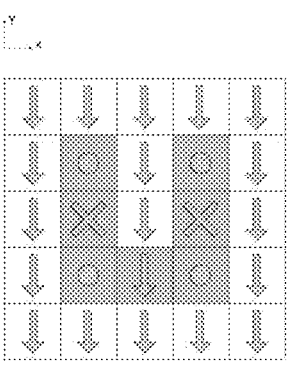
Figure 10:
Figure 10:
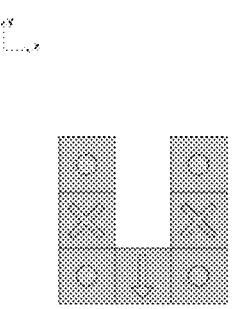

FIG. 10 illustrates an example patterning procedure:

Step 1001 (initialization) The permanent magnet 940 generates a magnetic field pointing to negative x direction. All magnetic dipoles align with it (arrows pointing to the same direction).

Step 1002 Rotate the permanent magnet 940 by 90 degrees. It generates a filed pointing to positive z direction. All magnetic dipoles align with it (shown as circles).

Step 1003 Cure 4 pixels with UV light 970 focused by objective lens 930. It initiates polymerization in these regions and freezes the orientation of dipoles within it.

Step 1004 Turn off UV light.

Step 1005 Rotate the magnet about y axis by 180 degrees. All magnetic dipoles that are located at uncured areas follow.

Step 1006 Cure 2 pixels with UV light 970.

Step 1007 Turn off UV light.

1008 Rotate the magnet 940 about positive x axis by 90 degrees. All free magnetic dipoles follow.

Step 1009 Cure one pixel.

Step 1010 Extract the cured magnetic sheet by washing away the extra resin (uncured UV-curable polymers).

Repeat the subroutine until finish programming the whole device.

Step 1011 is the final product.

A microrobot that has a more complex magnetization profile requires more steps for fabrication.

Characterization of the Microgripper

The behavior of the microgripper is determined by (a) the applied magnetic field, (b) its material properties (stiffness, elasticity and magnetization), and (c) its structural geometry. Magnetic particles in the elastic composite of the microgripper panels experience forces F and torques τ in the applied magnetic field B as F=(m·∇)B and $$\tau = m \times B, \quad (1)$$

where m and B are the magnetic moment and the magnetic flux density, respectively. The force is nonzero when the field is not uniform, and the torque exists until the particle's magnetic moment is aligned with the field direction. In this work, magnetic force is used to move the microgripper by pulling, while magnetic torque makes the microgripper grasp. For convenience, the magnetization direction of the base block is defined as the microgripper's positive direction. When magnetic field is absent, the microgripper remains stationary and fully open (i.e. flat, as shown in FIG. 1A), exhibiting a close-to-zero net magnetic moment (see FIG. 1E and FIG. 1I). From this state, if a magnetic field is applied along the microgripper's positive direction, the microgripper's limbs will bend in the positive direction and the microgripper will close (see FIGS. 1B and 1J). On the contrary, if the applied field is along the negative direction, the microgripper's limbs will deform towards its negative direction and make itself a 'bowl' shape. After the microgripper closes it forms an approximate cube or forms a 'bowl', its net magnetic moment increases along its central axis, and magnetic torque will always align the microgripper with the magnetic field. This alignment enables a different locomotion style, i.e., the microgripper rolls on a surface when the magnetic field rotates.

Figure 2A:
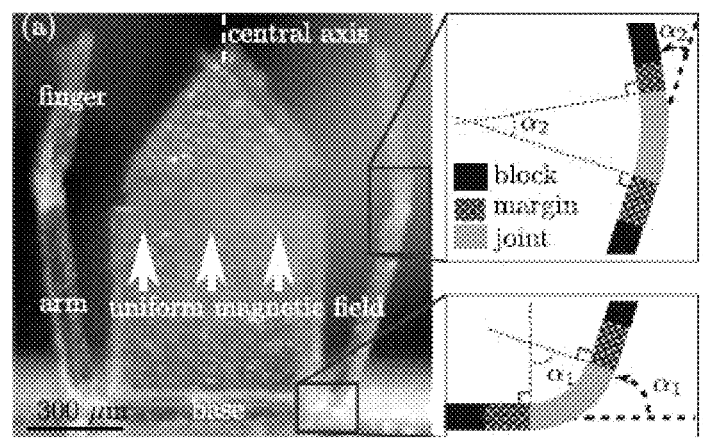
FIG. 2A is a photograph of a side of a 3D microgripper in accordance to one embodiment of the present invention (scale bar is 300 μm). The top and bottom inserts illustrate the bending angles $\alpha_1$ and $\alpha_2$.

To characterize the shape of the microgripper, the actuating magnetic torques need to be calculated first. Since the magnetization within a block (i.e. a panel) is equal everywhere, the magnetic torque τ on one block is $$\tau = (M \times B)V, \quad (2)$$

where M and V are the magnetization and the volume of this block, respectively. When the central axis of the microgripper is aligned with the applied magnetic field, the four limbs of the microgripper will be curled up by the magnetic torques and the microgripper closes. Thus, the deformation level of the microgripper is controlled by the magnitude of the applied magnetic torque. With the symmetric geometry and magnetization, the four limbs of the microgripper behave identically in theory and similarly in practice. Therefore, the deformation level of the microgripper can be represented by two bending angles $\alpha_1$ and $\alpha_2$ in radians defined in FIG. 2A. A succinct model based on the Euler-Bernoulli beam theory is proposed to relate the two bending angles to the strength of the applied magnetic field. It is assumed that the deformation only happens at the frame joints, whereas the blocks and the other part of the frame remain undeformed. The joint curvature κ in FIG. 2A is seen as $$\kappa_i = \alpha_i / L_i, \quad (3)$$

where i={1, 2}, and L is the joint's length. The curvature can also be calculated as $$\kappa_i = Q_i / (E_i I_i), \quad (4)$$

where Q, E, and I are the bending moment, the Young's modulus, and the second moment of area, respectively.

Knowing that E1=E2 and I1=I2, one can combine the two joint curvatures into one equation as $$\begin{bmatrix} \kappa_1 \\ \kappa_2 \end{bmatrix} = \frac{1}{EI} \begin{bmatrix} 1 & 1 \\ 0 & 1 \end{bmatrix} \begin{bmatrix} Q_1 \\ Q_2 \end{bmatrix}, \qquad (5)$$

and $$Q_i = |M| |B| V_i \sin \gamma_i, \qquad (6)$$

where i={1, 2}, and γ is the angle between the magnetization of the corresponding block (i.e. panel) and the applied magnetic field. Because the magnetic field is always aligned with the central axis of the microgripper, the angle γ can be calculated geometrically as $$\begin{bmatrix} \gamma_1 \\ \gamma_2 \end{bmatrix} = \begin{bmatrix} -1 & 0 \\ -1 & -1 \end{bmatrix} \begin{bmatrix} \alpha_1 \\ \alpha_2 \end{bmatrix} + \begin{bmatrix} \beta_{arm} \\ \beta_{finger} \end{bmatrix} + \frac{\pi}{2}, \qquad (7)$$

Combining formulas (1)-(5), one can merge the variables representing the physical properties of the microgripper into one magnetoflexural rigidity η=|M|/(EI).

Assuming η is known and the initial values of $\alpha_1$ and $\alpha_2$ are zero, the shape of the microgripper given by κ can be calculated iteratively until a converging value is reached.

Figure 2B:
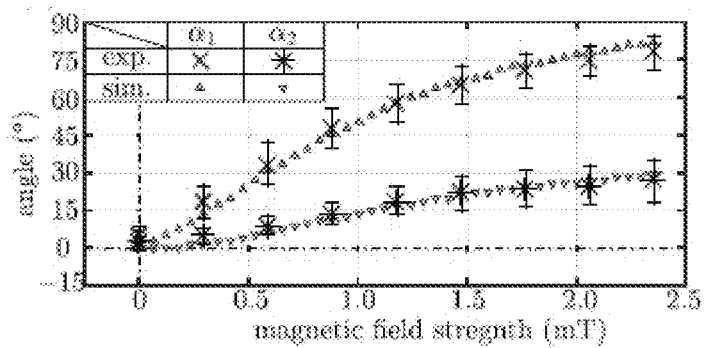
FIG. 2B illustrates the experimental results in water compared to predictions form the model. Each experimental data point is the man value of 24 measurements (6 times for each limb). The error bar of a data point corresponds to its standard deviation.
Figure 3:
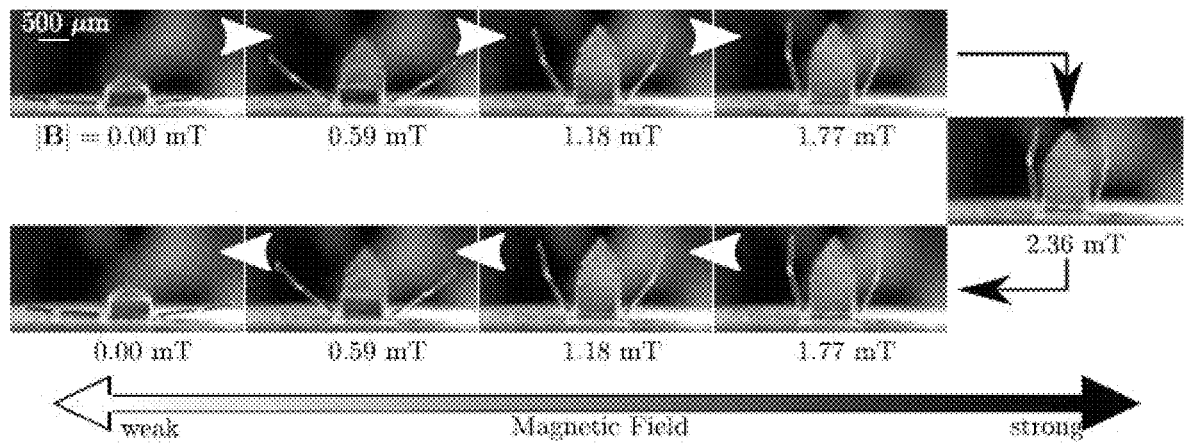
FIG. 3 shows a sequence of frames of the microgripper in the characterization experiment. The arrows between frames indicate the chronological order of the frames. The two-way arrow at the bottom shows the strength of the applied uniform magnetic field.

Fitting the simulated results to the measurements in a characterization experiment, one estimates the unknown coefficient to be η=6.69×10$^{17}$ AN$^{-1}$ m$^{-3}$. In addition, the magnetization value is independently measured to be |M|=47 kAm$^{-1}$, which is obtained by fitting the magnetic field generated by a polymer block that has the same magnetization amplitude with the microgripper to a magnetic dipole model. With this value of η, the simulated and experimental bending angles are plotted together in FIG. 2B. And FIG. 3 shows a sequence of frames of the microgripper in the characterization experiment, clearly showing that the microgripper closes as the magnetic fields increase in strength and opens as the magnetic fields weakens in strength. The agreement between the two data sets (i.e. simulated v. experimental) suggests that, although the Euler-Bernoullic beam theory does not contain a large-deflection model, it still gives a meaningful approximation of the deformation in our case. In nonuniform magnetic fields, the microgripper experiences magnetic torques and forces simultaneously. But it is observed that the magnetic torque effect dominates over any internal deformation due to magnetic forces. As a result, the 3D shape of the microgripper in nonuniform magnetic fields exhibits a pattern similar with the one in uniform magnetic fields: the microgripper closes in strong magnetic fields and opens in weak ones. Thus, magnetic forces are ignored in the preceding analysis.

Different with many other microgrippers in the literature, the microgripper of the present invention 'hugs' its cargo, instead of 'pinching' it at a point. This feature enables the microgripper to pick up cargoes with a wide variety of dimensions and geometries. But at the same time, it obscures the analysis of gripping force. A rough estimation shows that each arm and finger can apply forces up to 16 μN and 6 μN on the cargo in a magnetic field of 15 mT, respectively. This estimation is obtained from simulation results and is only expected to give an idea of the magnitude of the gripping force, as the actual force depends on the exact contact conditions. It assumes that the cargo is rigid and fully fills the internal space formed by the microgripper when it closes, forming surface contact with the microgripper's body.

Moving Velocity v. Field Gradient

When the microgripper is pulled by magnetic forces, a model is proposed to relate the microgripper speed and the applied field gradient, permitting a precise feedback control algorithm. Approximating the closed microgripper as a sphere with a radius r=350 μm, a fluid drag force Fd acts on the microgripper and is described by a corrected Stokes' drag model [19] including wall effects from the substrate as $$F_d = 6\pi \eta r \cdot v \left(1 + \frac{3}{8} Re + \frac{9}{16} \frac{r}{h}\right). \qquad (1)$$

where η is the fluid viscosity and v is the microgripper speed. The gap between the microgripper and the substrate h is assumed to be 30 μm. The net magnetic moment of the microgripper is aligned with the magnetic field gradient, which is along the y-axis of the global 3D coordinate. Thus, a magnetic force $F_m$ is generated along the y-axis as $$F_m = m \frac{dB}{dy}. \qquad (2)$$

Figure 2C:
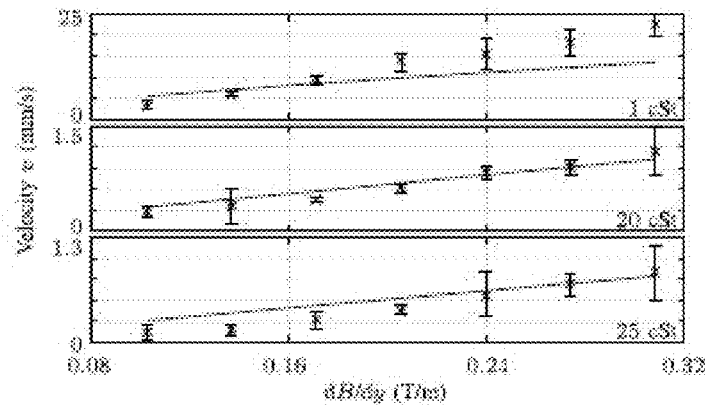
FIG. 2C illustrates the experimental results and theoretical predictions the 3D microgripper velocities in different cases. Black crosses are experimental data, and the lines show the theoretical predictions. Error bars represent the standard deviation.

Neglecting the friction, $F_m$ balances $F_d$ while v is constant. Equaling (1) to (2), the velocity v can be solved. To experimentally quantify the relationship between the microgripper speed and the field gradient, the microgripper is pulled on a 2D substrate along the y-axis by the forces generated by field gradients. Seven gradient values (from 0.10 to 0.31 T/m) are applied to move the microgripper in liquids with three different viscosity values (1 cSt, 20 cSt, and 25 cSt). Five trials are performed for each configuration and the results are plotted in FIG. 2C, together with the analytical predictions. The experimental and the predicted data suggest that the microgripper's speed is approximately proportional with the field gradient and inversely proportional with the fluid viscosity.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

Advantages of the present invention include a device for grasping and actively releasing objects having a design that permits (1) easy, secured grasping of micro or nanometer-sized objects; (2) rapid, highly reproducible, accurate release of the objects in target areas; (3) use of only a single magnetic field input to wirelessly control and activate the 3D gripper; (4) magnetic field itself is biocompatible (at the low frequencies used here) and can penetrate biological substances; (5) the grasping action is modelled with respect to the magnetic field amplitude, whose efficacy has been verified through experiments; this modelling allows one to control the grasping force to any required value by manipulating the magnetic field strength thereby allowing to grasp fragile objects gently; (6) the grasping is fast (Applicant has demonstrated 50 grasps per second speed) since the magnetic field can be changed quickly, and acts directly to open/close the gripper; and (7) the 3D shape of the gripper allows it to work with cargoes with various shapes and sizes (demonstrated in Examples below).

Having a non-magnetic frame results in a microgripper that is more controllable. The advantage of the frame being magnetic is that the microgripper is simpler to fabricate.

EXAMPLES

The examples are described for the purposes of illustration and are not intended to limit the scope of the invention.

Example 1—Set Up

Figures 4A, 4B:
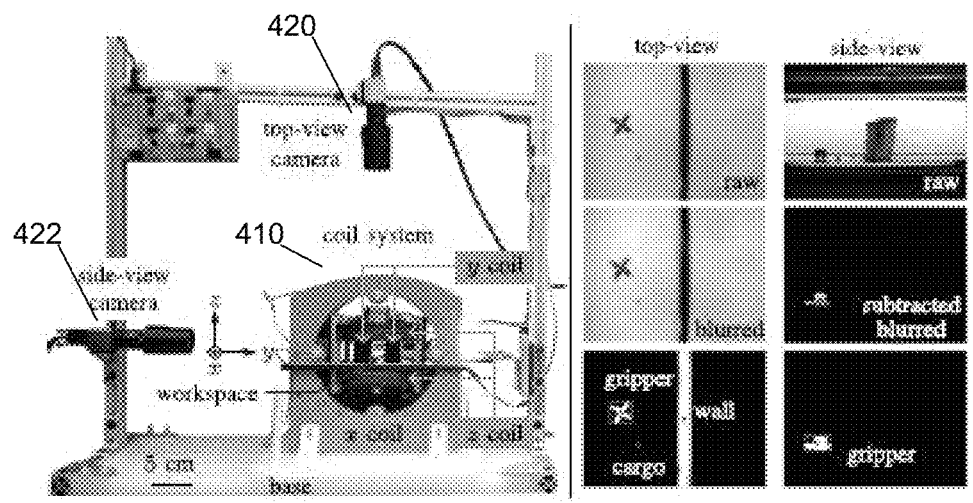
FIGS. 4A-4C illustrate experimental setup, image processing process, and the coil system and schematics showing its working principles. The experimental setup is shown in FIG. 4A with annotations. Power suppliers, current amplifiers, and the computer are not shown here for better visualization.
Figure 4C:
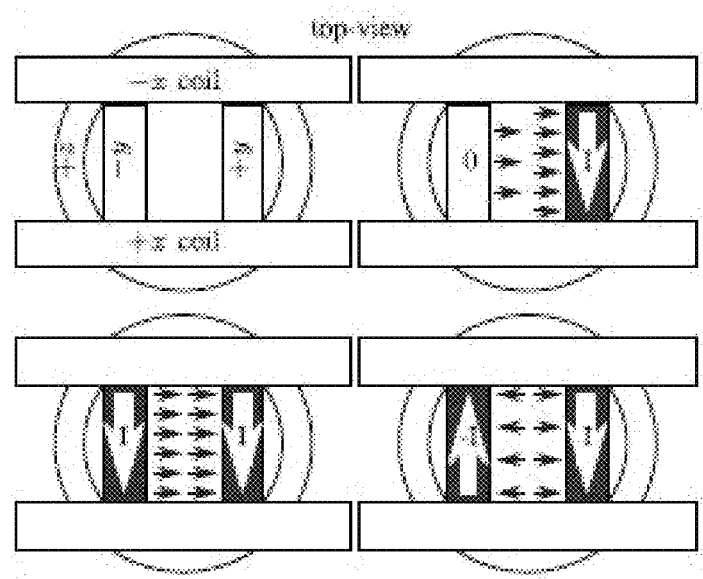
Figures 5A, 5B:
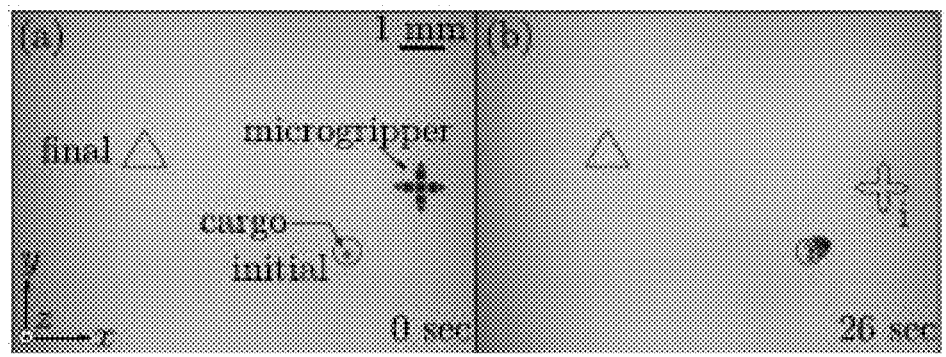
FIGS. 5A to 5F are experimental demonstrations of the 3D microgripper of the present invention. Four frames captured by a top-view camera during the pick-and-place experiment are shown chronologically in FIGS. 5A to 5D. The cargo's initial and final positions are marked out by a circle and a triangle, respectively. The path of the 3D microgripper is illustrated by dashed contours in time instances of (i) 0 s, (ii) 26 s, (iii) 60 s, and (iv) 66 s. Two frames of the microgripper performing fast close-and-open motions at 20 Hz are shown in FIGS. 5E and 5F.
Figures 5C, 5D:
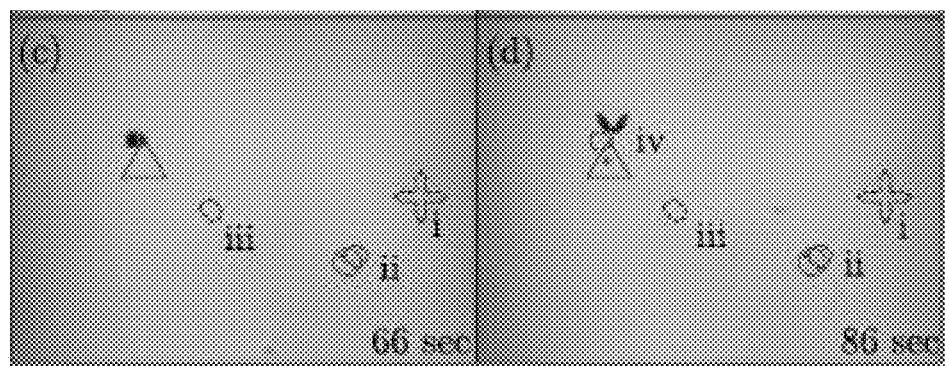
Figures 5E, 5F:
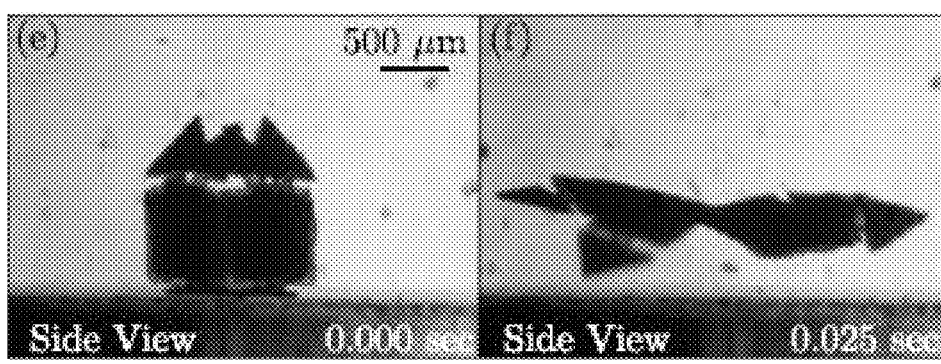

The microgripper is actuated and controlled by a magnetic field with controllable magnitude and direction, generated by a 3D electromagnetic coil system 410 (FIG. 4A) [5]. This system has six coils in three pairs arranged along three orthogonal axes, i.e., x, y and z axes. Only powering current to one coil of a pair generates field gradient in the workspace along the central axis of this coil pair (FIG. 4C, right top coil). A uniform magnetic field is achieved if both coils in a pair are powered with currents with the same direction and amplitude, as shown in FIG. 4C, left bottom coil). The strength of the resultant magnetic field is proportional to the current amplitude. As a result, this system can generate uniform field and also field gradient along an arbitrary 3D direction in its central workspace. The coils are powered by analog servo drives (30A8, Advanced Motion Controls), which receive inputs from a multifunction analog/digital I/O board (Model 826, Sensoray). Images of the workspace are captured by a 60 fps top-view camera 420 (FO134TC, FOculus) and fed to a custom program, which interacts with the user through a graphical user interface and sends commands to the I/O board.

The coils used in the experiments presented herein enclose an effective workspace of a 2 cm cube, which is large enough for manipulation tasks within petri dishes. Larger coil systems with open workspaces have been built using the same principles [20]. Currents in the six coils, which are nested along the x, y, and z axes symmetrically, are controlled independently by the input $I=[i1, i2, \ldots, i6]^T$ and generate a magnetic field B at the workspace, which exerts a force F and a torque $\tau$ on the microgripper.

The force F varies with the microgripper orientation, which is aligned with B by $\tau$. In addition, the field strength |B| needs to be controlled as it regulates the grasping of the microgripper. Thus, the output of interest is $Y=[B_x,B_y,B_z,F_x,F_y,F_z]^T$ and is related to the input I as $$Y = \begin{bmatrix} B \\ F \end{bmatrix} = A \cdot I, \quad (3)$$

where A is a 6×6 matrix that can be derived from the analysis in [21]. Thus, B and F are uniquely determined once the input I is specified. Inversing this relationship, the I can be obtained for the desired B and F by $$I=A^{-1}\cdot Y, \quad (4)$$

It should be noted that the coil system used in this study is not designed to generate magnetic forces. The fact that the coil system only has six coils in a symmetric configuration leads to singularities in (4), meaning that some combinations of B and F cannot be achieved. In addition, the amplifiers only work at currents up to 19 A. Alternatively, approximate forces can be applied on the microgripper without solving (4). The three pairs of coils are along the x, y and z axes, respectively. Uniform field is generated in the workspace when the two coils in the same pair run currents with the same amplitude and direction. Otherwise, the resultant magnetic field is non-uniform and magnetic forces will be exerted on the microgripper (FIG. 4C). Forces generated using this method are approximations because the coupling of the six coils and the microgripper orientation are not considered. Nevertheless, this method allows the user to control the range of the input current I and avoid extensive computations, and is therefore used as an alternative in the proposed controller.

Feedback Control System

Figure 6:
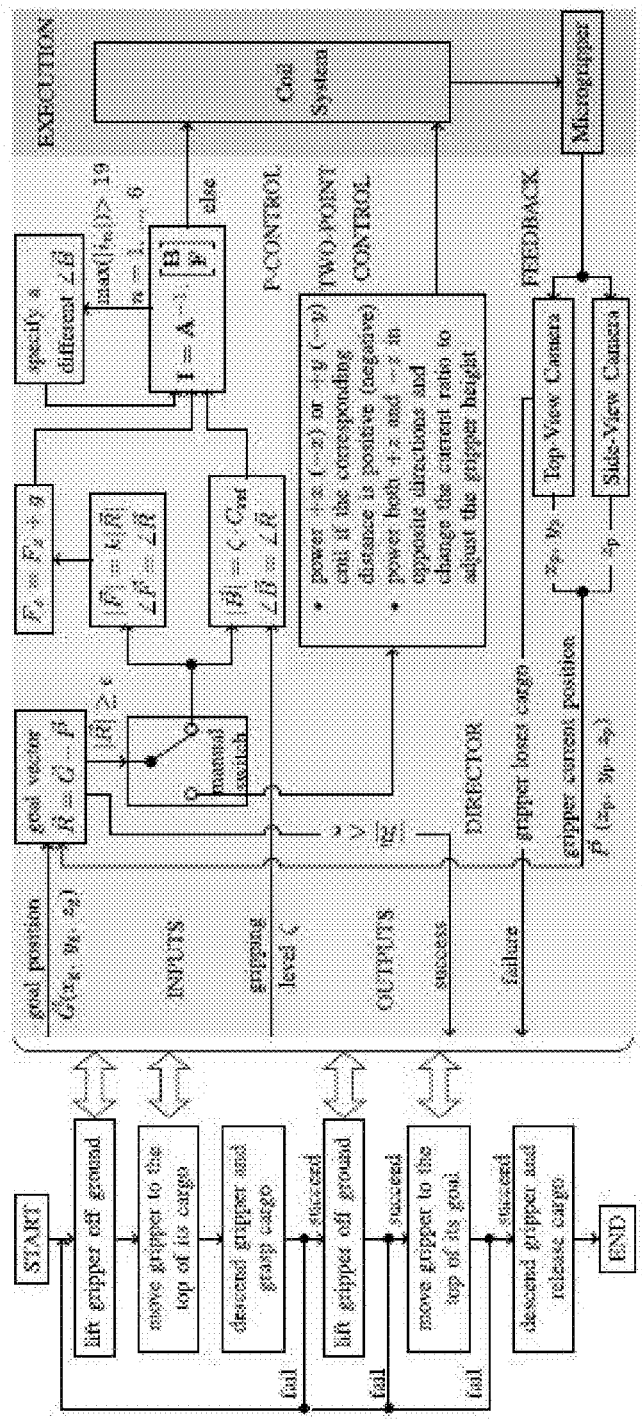
FIG. 6 Flow chart and block diagram of the feedback controller system for autonomous pick-and-place tasks. The 3D microgripper position is controlled based on the logic shown in the block diagram. One of the two low-level controllers, i.e., a P controller and a two-point controller, is enabled based on whether or not the magnetic force needs to be accurately regulated.

The microgripper 3D position is changed by applying either nonuniform magnetic fields to exert forces on the microgripper or rotating fields to roll the microgripper on surfaces. Controlling the position of the microgripper is nontrivial, and thus a high-level director is designed for this task together with two low-level controllers, including a proportional (P) controller and a two-point (on-off) controller. The structure of the control system is illustrated in FIG. 6. The P controller regulates both the direction and the amplitude of the force on the microgripper, while the two-point controller only manages the force direction. The two low-level controllers take the goal position and the grasping level as inputs while output a binary signal of 'success' or 'failure'. The goal position contains three coordinate values in the 3D workspace frame and is determined by the cargo position (before grasping) or the cargo destination (after grasping). The grasping level $\zeta \in [0, 1]$ decides the microgripper shape and the grasping action: the microgripper is fully open when $\zeta=0$ and fully closed when $\zeta=1$. In this work, $\zeta$ is either 0 or 1. Camera frames are processed as in FIG. 4B to track the microgripper position in real time: The x and y coordinates are obtained from the blurred and binarized top-view frame using a contour finding algorithm, while the side-view frame is subtracted from a reference background, blurred, and binarized to show the z coordinate. The controller monitors the microgripper position, builds a vector pointing from the microgripper to its goal, computes the corresponding currents for each coil using the selected low-level controller, and then outputs the calculated currents to the coil system.

The P controller regulates the applied magnetic force on the microgripper to position it in the 3D space: The desired force is determined proportionally based on the distance from the microgripper to its goal, with an offset to compensate its own weight. The parameter of the P controller is obtained from trial-and-error. The microgripper is specified to point towards its goal, and the required current set I is calculated using $$I=A^{-1}\cdot Y, \quad (4).$$

When magnetic actuation singularities are encountered or the calculated I exceeds the amplifier limit, a slightly different microgripper orientation is specified to retry (4) until a feasible I is obtained. In most cases, a feasible I can only be obtained after several trials, because the amplifier has a limited current range and no constraint is imposed on the calculation of (4). The repeated calculations of (4) make the P controller much more computationally expensive than the two-point controller. Thus, the manual switch in FIG. 6 is configured to the P controller only when the force amplitude needs to be controlled. Otherwise, the simpler two-point controller is selected. Powering the coil system with the obtained I, the desired 3D force will be applied on the microgripper. The alternative low-level controller is a two-point controller. The x-y position of the microgripper is altered by powering selected coils in the x and y coil pairs. To adjust the microgripper height (z coordinate), the +z and −z coils are powered with currents in opposite directions to generate a strong enough magnetic force to overcome the microgripper weight.

With the control over the microgripper position, a high-level director plans the paths and actions of the microgripper during pick-and-place tasks. Note that the controller only requires two cameras that track the centroids of the microgripper and the cargo, making the controller easier to implement than other ones that require precise and complicated feedback. This study focuses on demonstrating the capabilities of the proposed microgripper with simple control strategies and limited feedback. Considering that the integral (I) and the derivative (D) components of a PID controller are mainly used to minimize the steady-state error and the overshoot, respectively, using a PID in this work does not promise much performance benefits because the microgripper are doing waypoint-following instead of path-following tasks. The detailed investigations of controller parameter optimization, stability, and comparison with other controllers are beyond the scope of this paper and will be addressed in future research.

Example 2—Pick-and-Place

A pick-and-place experiment, in which the microgripper is immersed in water, is presented here to demonstrate the controllability of the microgripper of the present invention and its potentials in microrobotic applications.

In the pick-and-place experiment shown in FIGS. 5A-F, the microgripper moves to the cargo, i.e., a 400 μm polymer cube, grasps it, transports it, releases it, and then moves away from it in the following procedures. (1) The microgripper is closed by the magnetic field applied along +z-axis. (2) The field changes its direction to the x-y plane with the microgripper always aligned with the field. Horizontal field gradient is applied to pull the microgripper until it has touched its cargo. Then the field gradient is removed and the microgripper stops. (3) The field strength is reduced to slightly open the microgripper, and the field direction changes to −z, rolling the microgripper to the top of its cargo. The magnetic field is then removed and re-applied to open and close the microgripper, grasping the cargo to its hug. (4) Repeat step-2, but this time move the microgripper to the final position. (5) The magnetic field changes to −z direction, then its strength is reduced to zero and the microgripper opens, releasing the cargo. (6) Lastly, the magnetic field is applied along +z to bend the microgripper's limbs backwards. And the field direction gradually changes from +z to −z, rolling the microgripper 180° and away from the cargo. In this experiment, the microgripper is pulled by magnetic field gradients that are smaller than 0.2 T m$^{-1}$. It has been stated previously that this microgripper can also roll on a substrate, because it is always aligned with the field direction by magnetic torques. Experiment is implemented to demonstrate this alternative locomotion method. Currents described by $i=\cos(2\pi ft)$ and $i=\sin(2\pi ft)$ are provided to x and z coils, respectively. The superposition of magnetic fields generated by x and z coils forms a uniform magnetic field in the x-z plane with a constant strength and a rotating direction at frequency f. This rotating field rolls the microgripper on the x-y plane and the video of this experiment is available in the supplementary material. Rolling is especially useful when the microgripper moves near a planar surface or get stuck by frictions.

Additionally, the microgripper is able to repeat fast close-and-open motions up to 20 Hz in water at room temperature, because no time-consuming responses are involved in its working principle. Frames of the microgrippers doing fast close-and-open motions are captured by a high-speed side-view camera 422 (IL3, Fastec Imaging) and shown in FIGS. 5E-F. The underlying principles of the microgripper are not reliant on the fluid properties of the operating media. Thus the microgripper still works in media with different viscosity and density. But different properties may have an effect on the microgripper's behavior. When the fluid density is different with the microgripper's density, which, for the microgripper used in this experiment, is estimated to be 1.6 g cc$^{-1}$, extra magnetic forces need to be applied to overcome the gravity or buoyancy, making 3D locomotion more difficult (but not impossible) for the microgripper. The grasping speed of the microgripper is highly sensitive to the fluid drag, which is dependent on the viscosity. Higher viscosity value results in lower speed of the microgripper. A qualitative test is carried out in which the microgripper grasps in water and silicone oil with viscosity values of 20, 350, and 1000 cSt (25° C.). The microgripper still works, but its speed is inversely related to the fluid viscosity value. Results of this test is shown in the supplementary video, together with the two locomotion methods and the high-speed close-and-open motion of the microgripper.

Example 3—Grasping Characterization

Figure 7:
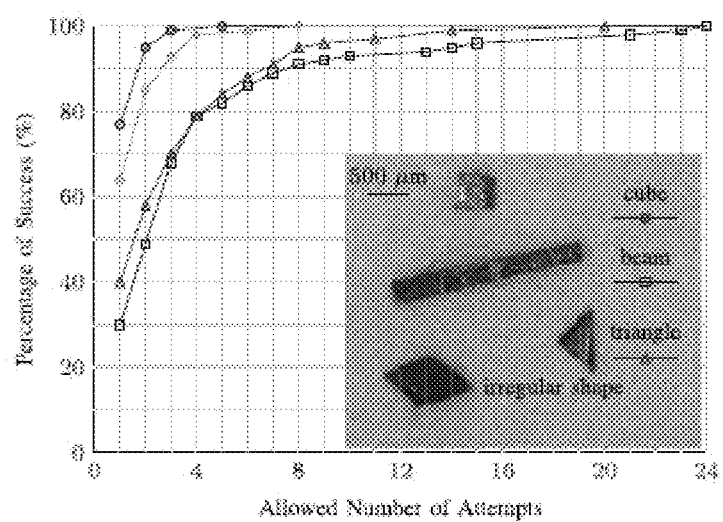
FIG. 7 Graph showing the results of the grasping characterization of the microgripper with different cargoes. A photograph of the cargoes are shown as the inset.

The grasping reliability is investigated with four cargoes made of polymer (Sylgard 184, Dow Corning) in different shapes (cube, triangular plate, beam, and irregular shape) (FIG. 7). In each trial, the two-point controller manipulates the microgripper in distilled water to keep attempting to grasp a cargo and lift it up until it succeeds. FIG. 7 shows the results of 100 consecutive trials for each cargo. Being more rounded, the cube and the irregular cargo fit into the microgripper regardless of their poses and therefore are easier to be picked up. In contrast, the triangular plate is thin and can easily escape the grasping no matter what its orientation is. The beam is the most difficult one, because it is longer than the microgripper limbs and the microgripper can only grasp a portion of it. Nevertheless, the microgripper of the present invention was able to grasp all four cargoes.

Table I shows that the average number of attempts to pick up a cargo is less than 4 for all cargoes, demonstrating the microgripper versatility that originates from its 3D structure and power grasping behavior. Since only the positions of the microgripper and the cargo are tracked, confusion arises in the algorithm when the microgripper visually occludes the cargo. A more comprehensive feedback should settle this confusion and also provide the orientation information of the microgripper and the cargo, thus reducing the number of attempts required for successfully grasping a cargo. Table I suggests one attempt takes about 0.8 second, starting when the microgripper begins to descend and ending after the microgripper has fully closed. The grasping is intentionally slowed down to prevent the microgripper from blowing the cargo away. If its speed is not limited, the microgripper can close within 25 ms in water using this electromagnetic coil. And the microgripper can deform even faster in a stronger magnetic field. Note that the fluid viscosity also affects the time of each attempt.

TABLE I

ANALYSIS OF THE GRASPING CHARACTERIZATION RESULTS

| Cargo Shape | No. of Attempt in One Grasping (avg. ± std.) | Time of Each Attempt (avg. ± std. second) | Success Probability (%) |
| --- | --- | --- | --- |
| cube | 1.30 ± 0.64 | 0.745 ± 0.035 | 76.9 |
| irregular | 1.64 ± 1.15 | 0.773 ± 0.042 | 61.0 |
| triangle | 3.18 ± 3.21 | 0.765 ± 0.043 | 31.4 |
| beam | 3.95 ± 4.65 | 0.780 ± 0.048 | 25.3 |

Example 4-3D—Autonomous Pick-and-Place

Figure 8A:
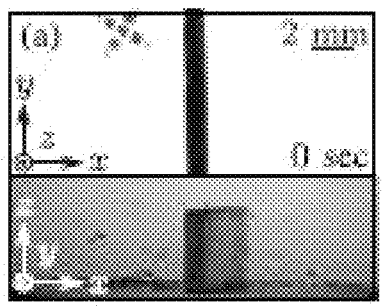
FIGS. 8A to 8I show the results of the autonomous 3D pick-and-place experiments. Top- and side-views of the workspace are shown chronologically in FIGS. 8A-8F. The process of re-grasping is shown in FIG. 8G with the cargo marked out by a dashed square. The microgripper position in experiments with the P controller and the two-point controller are shown in FIGS. 8H and 8I, respectively. Corresponding positions of the frames in FIGS. 8A-8F are labeled in FIG. 8H by their indexes. The solid line represents the first grasping attempt, while the dotted line stands for the second attempt.
Figure 8B:
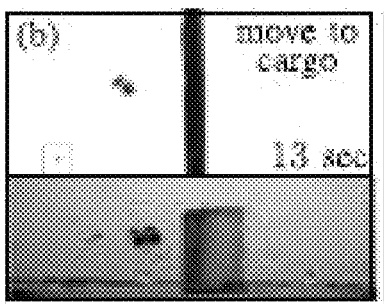
Figure 8C:
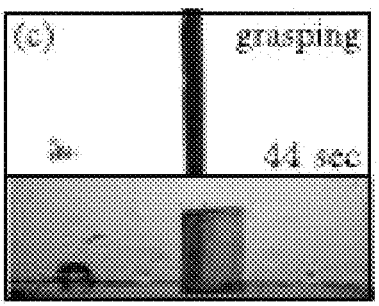
Figure 8D:
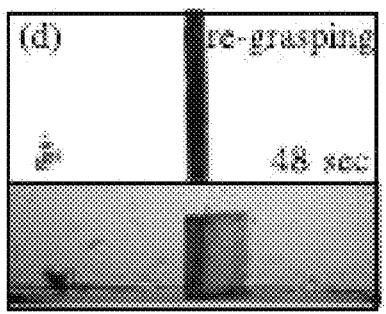
Figure 8E:
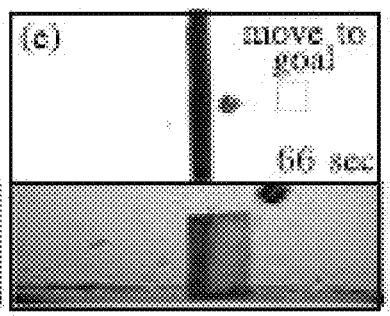
Figure 8F:
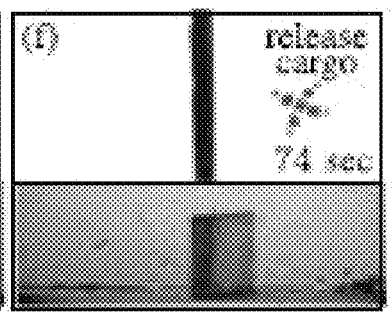
Figure 8G:
Figure 8H:
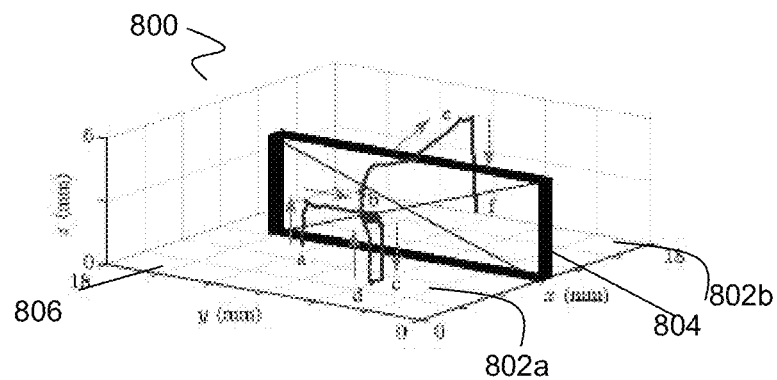
Figure 8I:
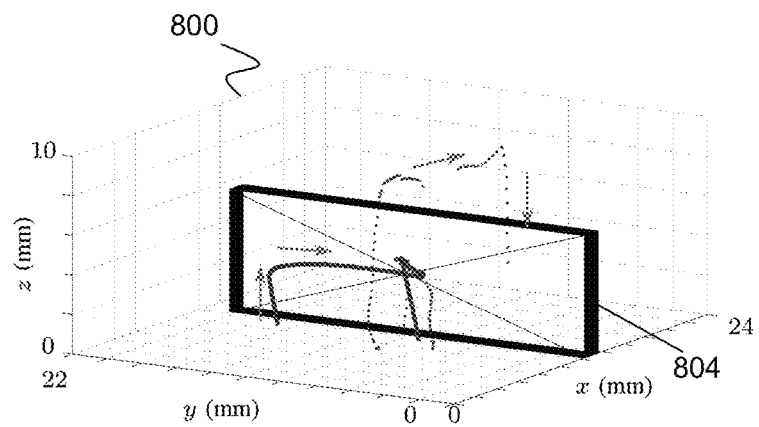

The microgripper is maneuvered to perform 3D autonomous pick-and-place tasks. With reference to FIGS. 8H and 8I, in a workplace 800 having different compartments 802a,b separated by walls 804 or other obstructions, the microgripper of the present invention picks up a cargo lying on the substrate 806 of one substrate 802a, carries it over the wall 804 or other obstruction, and delivers it to another compartment 802b of the workspace. In this process, the controller tracks the microgripper and the cargo, plans a path towards the goal that goes over the wall, detects whether or not the microgripper has successfully grasped its cargo, and monitors if the microgripper loses its cargo in transportation.

The P controller ("P-CONTROL" in FIG. 6) is used when the force amplitude on the microgripper needs to be regulated. To prevent the amplifiers from overheating, currents are applied with a 0.05 second interval between every 0.3 second. Silicone oil (20 cSt viscosity at 25° C.) is used as the media to slow down the microgripper, allowing the intermediate magnetic field to work. Note that if fluids with different viscosities or densities are used, the interval time needs to be adjusted. Frames are shown in FIGS. 8A-F with the 3D path of the microgripper in FIG. 8H. The microgripper points downwards when it descends to its cargo and changes its orientation to upwards after grasping, after which, the microgripper opens to allow the cargo to fall into its hug and re-grasps the cargo (FIG. 8G). The upwards orientation secures the cargo transportation. When the force amplitude on the microgripper is unimportant, the two-point controller is utilized. Since the I is directly specified instead of being calculated from $$I = A^{-1} \cdot Y,  \quad (4)$$

its current amplitude can be easily limited.

Therefore, the magnetic field is always applied and water is used instead of silicone oil to increase the operation speed. In this case, the execution time is shorter than the one required by the P controller: 16 versus 74 seconds. The microgripper path in this experiment is shown in FIG. 8I.

The results endorse the 3D locomotion capability of the microgripper and the efficacy of the proposed controller. Without being limited to the 2D plane, the microgripper can move to the top of the cargo, and then descend to grasp the cargo vertically, without disturbing the planar environment around the cargo, which potentially contains other microobjects.

Example 5—Bio-Compatibility Test

Results of a preliminary bio-compatibility test suggest that the microgripper does not leach toxic particles and the cells in direct contact with the microgripper could develop normal functions after being released. Thus, the microgripper could be suitable for biomedical applications.

It will be appreciated by those skilled in the art that other variations of the one or more embodiments described herein are possible and may be practiced without departing from the scope of the present invention.

Conclusions

This Examples described above demonstrates the reliable and versatile grasping of the microgripper of the present invention using simple control strategies and limited feedback information. Autonomous 3D micrograsping and cargo delivery are presented and characterized for the first time. With the 3D locomotion capability, the microgripper can pick up a cargo from a substrate without disturbing its surrounding planar environment, which is beneficial in manipulating cells inside a population. Even with limited optical feedback due to visual occlusions, the microgripper still successfully grasps all cargoes tested, when multiple attempts are allowed. The results of the above examples suggest that the micrograsping and the cargo delivery using autonomous magnetic microgrippers are versatile, reliable and agile. The microgripper of the present invention can be used for manipulating microobjects, e.g., cells, in remote confined environments, such as microfluidic channels for biomedical applications. The microgripper of the present invention may also be used in biomedical tasks such as biopsy, cell manipulation, and targeted drug delivery.

The above disclosure generally describes the present invention. Changes in form and substitution of equivalents are contemplated as circumstances may suggest or render expedient. Although specific terms have been employed herein, such terms are intended in a descriptive sense and not for purposes of limitation. Other variations and modifications of the invention are possible.

Example 6—Lithography Based Fabrication

In this example shown is a photolithography-based method for patterning permanent magnetic particles in elastic UV-curable resins by means of particle orientation. By successively orienting the particles with a magnetic field and selectively curing regions of the resin with UV light, this method can develop magnetic actuators which have fully programmable magnetization profiles.

The present result demonstrates soft microrobots that achieve controllable complex bending behaviors as well as forming three-dimensional architectures from two-dimensional magnetic composite materials.

In this method, the magnetization profile of a microrobot is programmed by physically orient the magnetic dipoles in uncured UV resin using an applied external magnetic field as shown schematically in FIG. 10. Once the desired local magnetization is reached, the UV light initiates polymerization at regions of the material, which preserves the magnetization within that region. This process is repeated for every part of the microrobot which has different magnetization. To handle the whole process automatically, a program is written to control the UV projector and the magnetic field at the same time.

The physical apparatus 900 illustrated in FIG. 9 includes a DLP-based lithography system and a magnetic field generator 940.

The lithography system comprises a UV DLP projector (405 nm) 920, a plano-convex lens 945 (N-BK7, Ø50.8 mm, f=75.0 mm, Thorlabs), two cube-mounted nonpolarizing beamsplitters 915, 925, a Nikon 10×/0.30 A microscope objective lens 930, and a fabrication stage 936 mounted on a vertical precision stage 935. A CMOS camera 905 is installed above the beamsplitters 915, 925, vertically aligned with the objective lens 930 and the fabrication stage 936. A cage assembly system holds all optical components in place to guarantee optical alignment. With digital micro mirrors serving as a digital mask, the binary image from the projector aperture passes through the plano-convex lens and the objective lens, casting a demagnified image (approximately 3.2 mm×2.0 mm) on the magnetic slurry. The vertical precision stage adjusts the height of the fabrication stage to the working distance of the microscope lens, bringing the projected image into focus.

The magnetic field is generated, in this example, by a 1" permanent magnet 940 under the fabrication stage 936. Two orthogonally-positioned stepper motors 942 rotate the magnet and change the direction of the magnetic field (FIG. 9). A 3D magnetic sensor (TLV493D-A1B6) for motor feedback is placed at the center of the fabrication stage. It is assumed that the magnetic field in the printing area (3.2 mm×2.0 mm) is nearly uniform.

Materials

First, ferrite magnetic powders (MQFP-15-7, NdPrFeB, Magnequench) were magnetized in a strong uniform magnetic field (1.1 T) generated by two one-inch N40 permanent magnets. Acquiring saturation remanence, the particles were mixed sufficiently with UV resin (DLP/SLA3D Printer UV Resin, Flexible Type, GC3D-EBE) in the mass ratio of 1:2 to form a homogeneous magnetic slurry.

Characterization of the Magnetic Profile within the Microgripper

The performance of the microgripper is dependent on a precise magnetization profile within the volume of the microgripper. To characterize this magnetization profile in a precise and detailed way we used a magneto-optic sensor (Magview-S from Matesy GmbH) to obtain the distribution of magnetic flux that is normal to the sensor plane at the surface of each sample. The data collected were fitted to a theoretical model to estimate the magnitude of magnetization.

In this method, the developed magnetization in determined by 2 factors: the direction and the magnitude of the magnetic field applied when curing the materials. Since the magnetic forces and torques applied to the materials are functions of local magnetization of the device (For example, the magnetic gripper needs to have 0 degrees, 30 degrees, and 60 degrees to work properly), it is important to program the magnetization accurately.

Figure 11A:
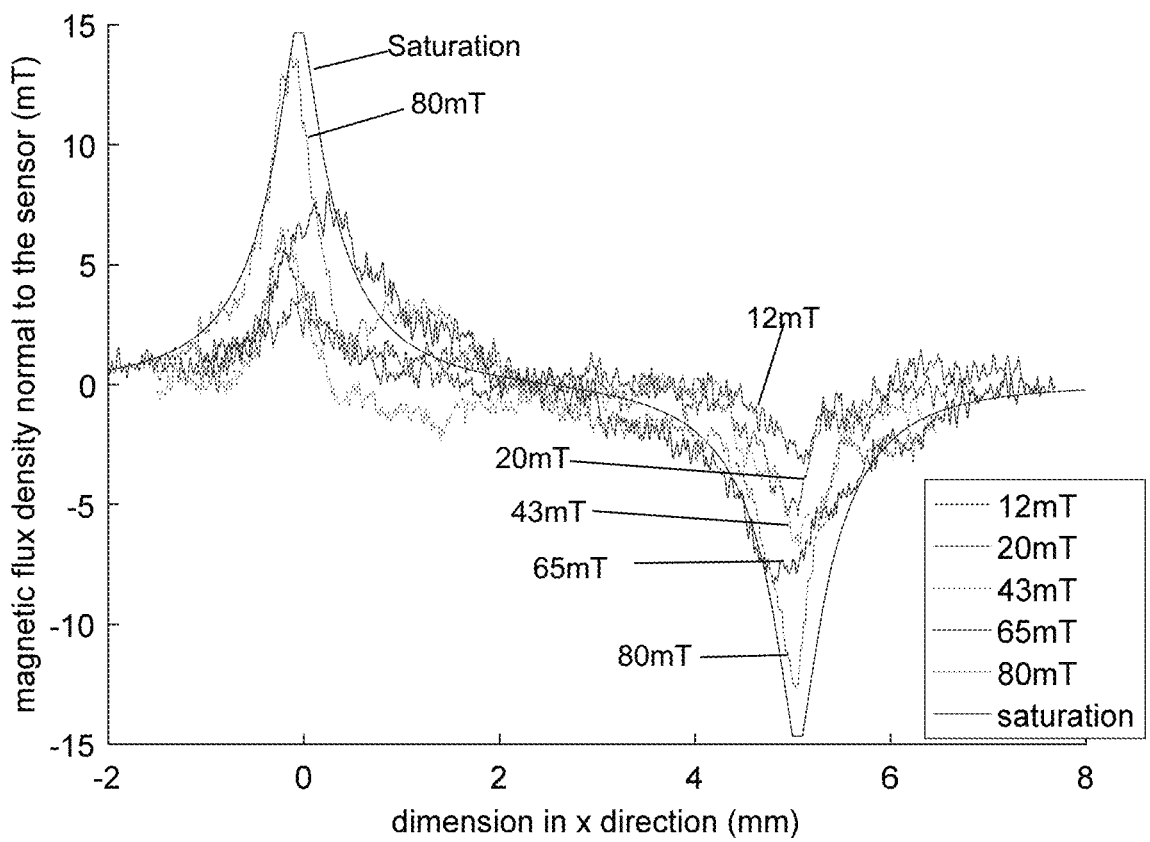
FIG. 11A: Normal components of the magnetic flux density at the near surface of each sample.
Figure 11B:
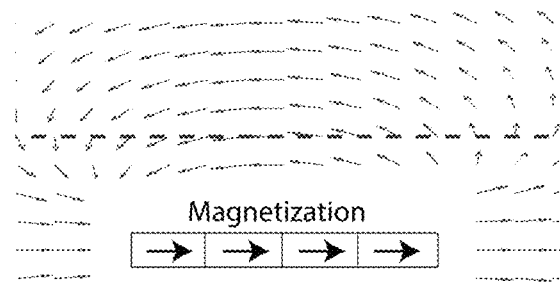
FIG. 11B: Schematic that shows the magnetization direction, magnetic field distribution, and the line of measurement (dashed line).

In general, the stronger the external magnetic field when the polymers are cured, the stronger the developed magnetization. The data in FIG. 11A show that when the external magnetic field is 80 mT, it develops a magnetization of approximately 75% of maximum remanent magnetization. Therefore, it may be preferable to generate a magnetic field as strong as 100 mT to rotate the particles fully.

The second factor to consider is whether the magnetization programmed in the microgripper is the same as the direction of the applied magnetic field during fabrication. Due to magnetic interaction between neighboring magnetic microparticles in the liquid polymer, there could be errors in the resulting magnetization direction. The same materials as in II-A were used in this experiment.

A sample was made by filling a 60-µm thick SU-8 mold with the magnetic slurry and covering it with a microscope coverslip. Each sample was placed at the center of the fabrication stage, exposed to the field generated by the permanent magnet. Since the near-equilibrium magnetic torque is weak, we applied to the magnet a tiny oscillation with linear amplitude decay to accelerate the rotation of magnetic dipoles in the slurry before curing. In this experiment, 6 samples were collected for each magnetic field angle (0°, 15°, 30°, 45°, 60°, 75°, and 90°). To measure the direction of magnetization, each sample was extracted from the mold and mounted on the wall of an acrylic raft that can rotate freely on water surface. The magnetization angle was measured by reading the angle formed by the wall of the raft and the external magnetic field in a top view camera.

Figure 12:
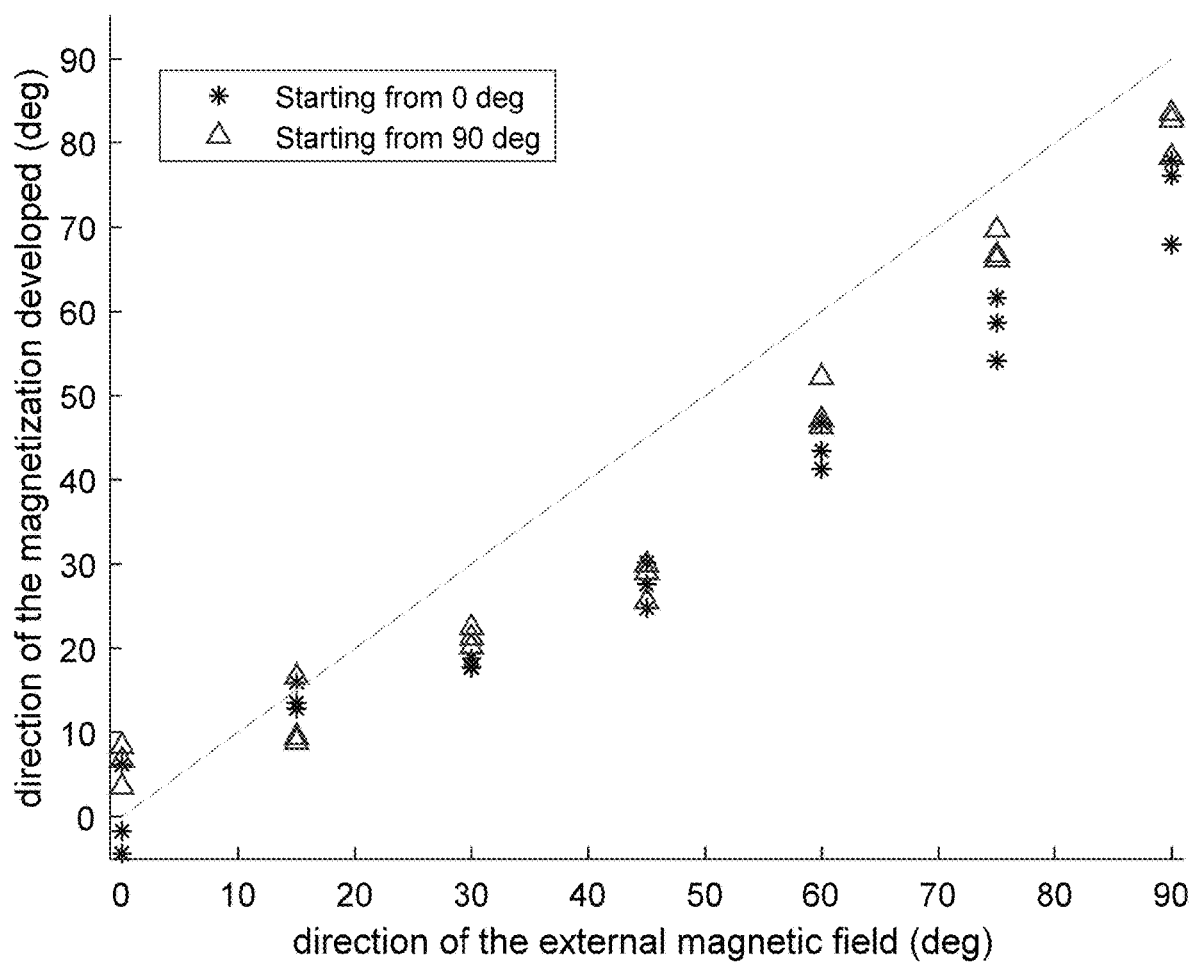
FIG. 12 illustrates the relationship between the direction of developed magnetization and the direction of the external magnetic field applied when curing. Samples were fabricated for two different initial conditions. The line shows a perfect alignment.

FIG. 12 shows the relationship between the measured magnetization angle of the samples, and the direction of the external magnetic field in which the samples were cured. Regardless of initial conditions, the direction of induced magnetization shows a good agreement with the field direction when the external field is within 0° to 15°. The magnetization angle starts to fall behind the field angle by 10° when the applied field is 30°, and the gap becomes even larger by 10° to 20° when the applied field is 45° to 90°. For each applied field angle, the initial conditions also slightly influence the angle of the developed magnetization, but it is reasonable to expect that the difference can be eliminated if longer time was allowed for magnetic particle alignment. The trend of the data can be explained by the demagnetizing field acting on the magnetic dipoles. When an external magnetic field is applied, magnetic particles try to reach a new equilibrium state by realignment. However, as the magnetic particles tend to sink to the bottom of the photopolymer, the demagnetizing field of the surrounding dipoles reduces the total magnetic moment and thus slows down the orientation process. Besides, the remanent magnetization of magnetic particles causes unfavorable formation of magnet chains in the material. This may require extra energy for the particles to break the chains and realign themselves with the externally applied magnetic field.

Figure 13A:
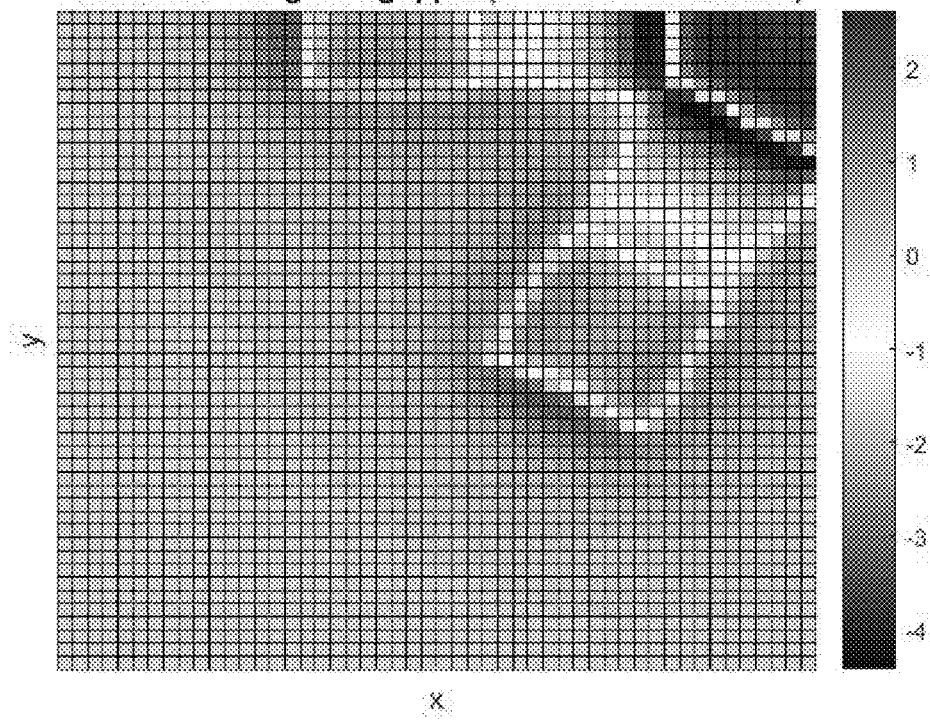
FIG. 13A illustrates numerical computation of the out-of-plane magnetic flux density at the near surface (60 micrometers away from the surface) of a six-arm magnetic gripper (unit: mT).
Figure 13B:
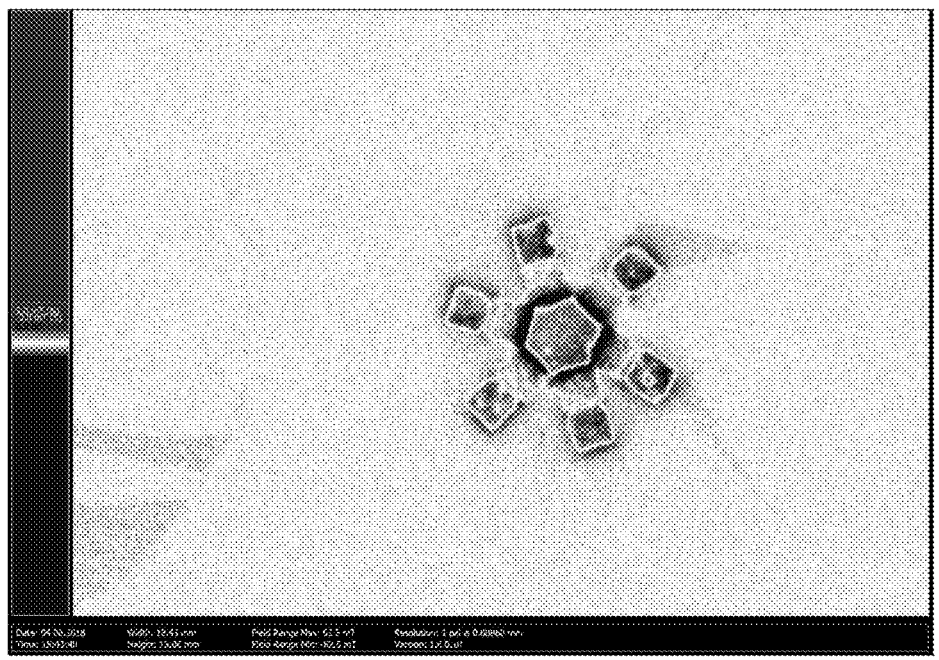
FIG. 13B illustrates a measured value of the out-of-plane magnetic flux density at the near surface (60 micrometers away from the surface) of a six-arm magnetic gripper using a magneto-optical sensor.

FIG. 13 shows the magnetic field measured at the surface of a six-armed Microgripper using the Magview-S to show the overall magnetization profile which is achieved. Distinct regions are seen for each magnetic region of the Microgripper.

Results

Each column of FIG. 14 shows (from left to right) the following of each device:
  magnetization profile;
  the diagram of the gripper in an actuated configuration (arrow represents the direction of the actuating magnetic field)
  an image when no magnetic field is applied (non-actuating configuration)
  an image when magnetic field is applied (actuating configuration).

REFERENCES

1. Diller E D, Giltinan J, Lum G Z, Ye Z and Sitti M 2015 Int. J. Robot. Res. 35 114-28.
2. Zhang J, Jain P and Diller E 2016 Independent control of two millimeter-scale soft-bodied magnetic robotic swimmers IEEE Int. Conf. on Robotics and Automation pp 1933-8.
3. Mahoney A, Nelson N, Peyer K, Nelson B and Abbott J 2014 Appl. Phys. Lett. 104 144101.
4. Diller E, Giltinan J, Jena P and Sitti M 2013 Int. J. Robot. Res. 32 614-31.
5. Zhang J and Diller E 2015 Millimeter-scale magnetic swimmers using elastomeric undulations IEEE/RSJ Int. Conf. on Intelligent Robots and Systems (Hamburg, Germany) pp 1706-11.

6. Diller E, Zhuang J, Lum G Edwards M and Sitti M 2014 Appl. Phys. Lett. 104 174101.
7. Yamanishi Y, Sakuma S, Onda K and Arai F 2010 Biomed. Microdevices 12 745-52.
8. Barbot A, Decanini D and Hwang G 2016 Sci. Rep. 6 19041
9. Tasoglu S, Diller E, Guven S, Sitti M and Demirci U 2014 Nat. Commun. 5 3124.
10. Ye Z, Diller E and Sitti M 2012 J. Appl. Phys. 112 064912
11. Kuo J C, Tung S W and Yang Y J 2014 Sensors Actuators A 211 121-30.
12. Chung S E, Dong X and Sitti M 2015 Lab Chip 15 1667-76.
13. Walker R, Gralinski I, Keong Lay K, Alan T and Neild A 2012 Appl. Phys. Lett. 101 163504.
14. Vasudev A and Zhe J 2008 Appl. Phys. Lett. 93 103503.
15. Breger J C, Yoon C, Xiao R, Kwag H R, Wang M O, Fisher J P, Nguyen T D and Gracias D H 2015 ACS Appl. Mater. Interfaces 7 3398-405.
16. Randhawa J S, Leong T G Bassik N, Benson B R, Jochmans M T and Gracias D H 2008 J. Am. Chem. Soc. 130 17238-9.
17. Diller E and Sitti M 2014 Adv. Funct. Mater. 24 4397-404.
18. Diller E D, Miyashita S and Sitti M 2012 RSC Adv. 2 3850-6.
19. P. Vasseur and R. Cox, "The lateral migration of spherical particles sedimenting in a stagnant bounded fluid," J. Fluid Mech., vol. 80, no. 3, pp. 561-591, 1977.
20. B. Kratochvil et al., "MiniMag: A hemispherical electromagnetic system for 5-DOF wireless micromanipulation," in Experimental Robotics, O. Khatib, V. Kumar, and G Sukhatme, Eds. Berlin, Germany: Springer-Verlag, 2014, pp. 317-329.
21. A. Petruska and B. Nelson, "Minimum bounds on the number of electromagnets required for remote magnetic manipulation," IEEE Trans. Robot., vol. 31, no. 3, pp. 714-722, June 2015.

While certain embodiments have been illustrated and described in the foregoing examples, it will be understood that changes and modifications can be made in the foregoing devices and processes in accordance with ordinary skill in the art without departing from the present invention in its broader aspects as defined in the following claims.

What is claim is:

1. A three-dimensional (3D) untethered mobile actuator comprising:
    (a) a magnetized base panel having at least two lateral sides and a central axis extending normal to the magnetized base panel, wherein the magnetized base panel comprises embedded permanent magnetic particles magnetized to a predefined magnetization angle to produce a magnetic moment at a magnetization angle of $\beta_{base}$;
    (b) two or more magnetized arm panels, each magnetized arm panel having a first lateral side and an opposing second lateral side, the first lateral side connected to one of the at least two lateral sides of the magnetized base panel, wherein each of the two or more magnetized arm panels comprises embedded permanent magnetic particles magnetized to a predefined magnetization angle to produce a magnetic moment at a magnetization angle of $\beta_{arm}$;
    (c) two or more magnetized finger panels, each magnetized finger panel having a first lateral side connected to the second lateral side of one of the two or more arm panels, wherein each of the two or more magnetized finger panels comprises embedded permanent magnetic particles magnetized to a predefined magnetization angle to produce a magnetic moment at a magnetization angle of $\beta_{finger}$; and
    (d) a continuous frame that borders each of the magnetized base panel, magnetized arm panels, and magnetized finger panels, the continuous frame comprising flexible joint structures to connect each connected lateral side of the magnetized base panel, magnetized arm panels, and magnetized finger panels;
    wherein each of the magnetic moments at $\beta_{base}$, $\beta_{arm}$, and $\beta_{finger}$ is in a different direction from the magnetic moment of an adjacent panel, wherein in the absence of an applied magnetic field, the magnetic moments at magnetization angles of $\beta_{base}$, $\beta_{arm}$, and $\beta_{finger}$ exhibit a close-to-zero net magnetic moment to configure the actuator into a substantially flat structural configuration relatively normal to the central axis,
    and application of a magnetic field actuates a magnetic torque to align the magnetic moments at magnetization angles of $\beta_{base}$, $\beta_{arm}$, and $\beta_{finger}$ with the magnetic field, wherein the magnetized arm panels and the magnetized finger panels move out-of-plane from the magnetized base panel towards the central axis to configure the actuator into a hollowed polyhedral structural configuration.

2. The 3D untethered mobile actuator of claim 1, wherein the magnetic moment at $\beta_{base}$ is in a direction that is about parallel to the central axis, and the magnetic moments at $\beta_{arm}$, and $\beta_{finger}$ are each about anti-parallel to the central axis.

3. The 3D untethered mobile actuator of claim 2, wherein the magnetic moments at $\beta_{arm}$, and $\beta_{finger}$ are each in a direction that is about oblique to the central axis.

4. The 3D untethered mobile actuator of claim 3, wherein the magnetic moment at $\beta_{base}$ is about −90°.

5. The 3D untethered mobile actuator of claim 4, wherein the magnetic moment at $\beta_{arm}$ is about 25°, and the magnetic moment at $\beta_{finger}$ is about 80°.

6. The 3D untethered mobile actuator of claim 1, wherein the magnetized base panel, the magnetized arm panels, and the magnetized finger panels are made of a polymer with the embedded permanent magnetic particles.

7. The 3D untethered mobile actuator of claim 1, wherein the 3D actuator has a centrosymmetric four-limb structure with one magnetized base panel, four magnetized arm panels and one magnetized finger panel extending from one of the four magnetized arm panels, wherein under the influence of the magnetic field, the 3D untethered mobile actuator forms a substantially cubical hollowed structure.

8. The 3D untethered mobile actuator of claim 1, wherein the magnetized finger panel includes a free end.

9. The 3D untethered mobile actuator of claim 1, wherein the magnetized base panel and the magnetized arm panel are quadrilateral, and the magnetized finger panel is trilateral or quadrilateral.

10. The 3D untethered mobile actuator of claim 1, wherein the frame is non-magnetized and made of the flexible elastomer devoid of magnetic materials.

11. The 3D untethered mobile actuator of claim 6, wherein the magnetized base panel, the magnetized arm panels, and the magnetized finger panels are made of a mixture comprising a substantially stiff polymer with the embedded permanent magnetic particles, and the frame being made of a flexible elastomer.

12. The 3D untethered mobile actuator of claim 6, wherein the mass ratio of permanent magnetic particles to polymer is between about 1:10 to 2:1.

13. The 3D untethered mobile actuator of claim 6, wherein the mass ratio of permanent magnetic particles to polymer is 1:1.

14. The 3D untethered mobile actuator of claim 1, wherein the 3D untethered mobile actuator is a 3D untethered mobile microgripper.

15. The 3D untethered mobile actuator of claim 1, wherein the 3D untethered mobile actuator comprises a centrosymmetric limb structure with one magnetized base panel, three or more magnetized arm panels and three or more magnetized finger panels, and the magnetization angle $\beta_{base}$ is −90°, the magnetization angle $\beta_{arm}$ is 25°, and the magnetization angle $\beta_{finger}$ is 80°.

16. The 3D untethered mobile actuator of claim 1, wherein the application of the magnetic field is in a positive direction relative to the central axis.

17. The 3D untethered mobile actuator of claim 1, wherein the application of the magnetic field is in a negative direction relative to the central axis.

18. A method of manufacturing the 3D untethered mobile actuator of claim 1, wherein the method comprises:
(a) providing negative molds for each of the two or more panels and a negative mold for the frame;
(b) pouring a mixture of a first polymer with permanent magnetic particles into the negative molds to form panels;
(c) magnetizing the panels;
(d) placing the magnetized panels in the mold for the frame and pouring a second polymer to connect neighboring magnetized panels; and
(e) removing the 3D untethered mobile actuator from the mold for the frame, thereby providing the 3D untethered mobile actuator.

19. The method of claim 18, wherein the panels are magnetized based on their position in the 3D untethered mobile actuator such that each panel has a magnetic moment in a different direction than a neighboring panel and the 3D untethered mobile actuator closes into an actuated configuration when a magnetic field is applied.

20. The method of claim 18, wherein the magnetizing of step (c) comprises (i) mounting the panel to be magnetized on a stage at a predefined tilting angle β, and (ii) exposing the panel to a uniform magnetic field, wherein the tilting angle β is a tilting angle of the panel with respect to the applied uniform magnetic field.

21. The method of claim 20, wherein the tilting angle β is selected to close the 3D untethered actuator in an applied magnetic field along a central axis of the 3D untethered actuator.

22. The method of claim 20, wherein the 3D untethered mobile actuator is the 3D untethered mobile actuator of claim 1, and the tilting angle β for the base is −90°, the tilting angle β for the magnetized arm panel is 25°, and the tilting angle β for the magnetized finger panel is 80°.

23. The method of claim 18, wherein the second polymer is relatively more flexible than the first polymer.

24. The method of claim 18, wherein the frame is devoid of magnetic particles.

25. The method of claim 18, wherein a mass ratio of permanent magnetic particles to first polymer is between about 1:10 to 2:1 or 1:1.

26. A method of manufacturing the 3D untethered mobile actuator of claim 1, wherein the method comprises:
(a) providing a substrate having a layer comprising a mixture of magnetic particles and UV-curable polymers; and
(b) successively orienting the magnetic particles with a magnetic field and selectively curing regions of the layer with UV light.

27. The method of claim 26, wherein step (b) comprises:
(i) exposing the layer to an applied magnetic field in a first magnetization direction;
(ii) curing with UV selected first areas of the substrate such as the selected first areas retain the magnetization into the first magnetization direction;
(c) rotating the applied field to a second magnetization direction and exposing the layer to the second magnetization direction;
(d) polymerizing selected second areas of the layer such that the second selected second areas retain the magnetization into the second magnetization direction; and
(e) optionally repeating steps (a) to (d) for other areas; thereby producing a 3D untethered mobile actuator.

* * * * *

UNITED STATES PATENT AND TRADEMARK OFFICE
CERTIFICATE OF CORRECTION

PATENT NO. : 11,285,599 B2
APPLICATION NO. : 16/003612
DATED : March 29, 2022
INVENTOR(S) : Eric Diller et al.

Page 1 of 1

It is certified that error appears in the above-identified patent and that said Letters Patent is hereby corrected as shown below:

On the Title Page

Item (72)
"Eric Diller, Toronto (CA); Jiachen Zhang, Toronto (CA)" should read, -- Eric Diller, Toronto (CA); Jiachen Zhang, Toronto (CA); Tianqi Xu, Toronto (CA) --.

Signed and Sealed this
Twenty-sixth Day of December, 2023

Katherine Kelly Vidal
*Director of the United States Patent and Trademark Office*